United States Patent
Furukawa et al.

(10) Patent No.: US 8,791,692 B2
(45) Date of Patent: Jul. 29, 2014

(54) MAGNETIC POSITION DETECTING DEVICE

(75) Inventors: Taisuke Furukawa, Chiyoda-ku (JP); Koichi Akiyama, Chiyoda-ku (JP); Takeharu Kuroiwa, Chiyoda-ku (JP); Yuji Kawano, Chiyoda-ku (JP); Hiroshi Kobayashi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 158 days.

(21) Appl. No.: 13/519,927

(22) PCT Filed: Dec. 14, 2010

(86) PCT No.: PCT/JP2010/072467
§ 371 (c)(1), (2), (4) Date: Jun. 29, 2012

(87) PCT Pub. No.: WO2011/102050
PCT Pub. Date: Aug. 25, 2011

(65) Prior Publication Data
US 2012/0280677 A1     Nov. 8, 2012

(30) Foreign Application Priority Data
Feb. 17, 2010   (JP) .................... 2010-032394

(51) Int. Cl.
G01B 7/14       (2006.01)
G01B 7/30       (2006.01)
G01R 33/06      (2006.01)
G01D 5/14       (2006.01)
G01D 5/244      (2006.01)
G01R 33/09      (2006.01)
G01R 33/00      (2006.01)
G01R 29/12      (2006.01)

(52) U.S. Cl.
CPC ............... G01D 5/147 (2013.01); G01D 5/145 (2013.01); G01D 5/24438 (2013.01); G01R 33/09 (2013.01); G01R 29/12 (2013.01)
USPC ............. 324/207.21; 324/207.11; 324/207.25

(58) Field of Classification Search
CPC ... G01D 5/145; G01D 5/147; G01D 5/24476; G01D 5/24438; G01D 5/245; G01D 5/16; G01B 7/30; G01B 7/003; G01R 33/09; G01R 29/12
USPC ............ 324/166, 173, 174, 179, 252, 207.11, 324/207.2, 207.21, 207.22, 207.23, 207.24, 324/207.25, 207.26
See application file for complete search history.

(56) References Cited

U.S. PATENT DOCUMENTS 5,585,719 A    12/1996  Endo et al.
6,211,669 B1    4/2001  Yokotani et al.
(Continued)

FOREIGN PATENT DOCUMENTS

DE   10 2007 025 000 B3   12/2008
DE   10 2011 101 009 A1    5/2012
(Continued)

OTHER PUBLICATIONS

International Search Report Issued Mar. 15, 2011 in PCT/JP10/72467 Filed Dec. 14, 2010.
Office Action issued Sep. 27, 2013, in German Patent application No. 11 2010 005 280.8 with English translation.

* cited by examiner

*Primary Examiner* — Jermele M Hollington
*Assistant Examiner* — Raul Rios Russo
(74) *Attorney, Agent, or Firm* — Oblon, Spivak, McClelland, Maier & Neustadt, L.L.P.

(57) ABSTRACT

A magnetic position detecting device includes a magnet; first to fourth magnetoelectric conversion elements formed on a virtual plane; and a flux guide made of a magnetic material. The flux guide includes first and second protrusions provided at a distance from each other in a direction parallel to the virtual plane. A specific portion recessed in a concave shape is provided in the flux guide in a mid-portion between the first and second protrusions. The first and fourth magnetoelectric conversion elements are provided approximately in the mid-portion between the first and second protrusions. The second magnetoelectric conversion element is provided between the first protrusion and the mid-portion.

10 Claims, 24 Drawing Sheets

(56) References Cited

U.S. PATENT DOCUMENTS

| | | |
|---|---|---|
| 6,977,497 B1 | 12/2005 | Yokotani et al. |
| 2002/0101233 A1 | 8/2002 | Yokotani et al. |
| 2004/0017188 A1* | 1/2004 | Yokotani et al. ......... 324/207.21 |
| 2004/0095130 A1 | 5/2004 | Yokotani et al. |
| 2007/0047152 A1 | 3/2007 | Furukawa et al. |
| 2007/0114991 A1* | 5/2007 | Tatenuma et al. ........ 324/207.25 |
| 2007/0170913 A1* | 7/2007 | Yokotani et al. ......... 324/207.22 |
| 2008/0116885 A1 | 5/2008 | Van Zon et al. |
| 2009/0322325 A1 | 12/2009 | Ausserlechner |
| 2012/0126797 A1 | 5/2012 | Kawano et al. |

FOREIGN PATENT DOCUMENTS

| | | |
|---|---|---|
| JP | 7 4988 | 1/1995 |
| JP | 9 166612 | 6/1997 |
| JP | 11 325959 | 11/1999 |
| JP | 2002 228733 | 8/2002 |
| JP | 2004 109113 | 4/2004 |
| JP | 2006 29890 | 2/2006 |
| JP | 2007 64813 | 3/2007 |

(A)

(B)

(A)

(B)

ROTATION ANGLE OF MAGNETIC MOVING BODY (A)

(B)

(A)

(B)

MAGNETIC POSITION DETECTING DEVICE

TECHNICAL FIELD

The present invention relates to a magnetic position detecting device magnetically detecting movement of a magnetic moving body.

BACKGROUND ART

There is a known detecting device detecting the rotational position of a magnetic moving body using a magnet and a magnetoelectric conversion element. The magnetoelectric conversion element referred herein means an element having a resistance value that changes in accordance with the applied magnetic field, such as an MR (Magneto-Resistance) element, a GMR (Giant Magneto-Resistance) element, and a TMR (Tunnel Magneto-Resistance) element.

For example, the magnetic position detecting device disclosed in Japanese Patent Laying-Open No. 2004-109113 (PTL 1) includes a processing circuit unit and a magnet. The processing circuit unit is disposed above and spaced apart from a plane of a magnetic moving body rotating in the circumferential direction and having a peripheral edge portion that is provided with a plurality of radially protruding protrusions. The processing circuit unit has a bridge circuit including the first magnetoresistance segment and the second magnetoresistance segment. The magnet applies a magnetic field to the first and second magnetoresistance segments, and also applies a magnetic field to the magnetic moving body in the direction of the rotation axis line of the magnetic moving body. The second magnetoresistance segment is disposed approximately on the center line in the width dimension in the circumferential direction of the magnet as seen in the direction of the rotation axis line. The first magnetoresistance segment is disposed on the side to which the magnetic moving body is displaced with respect to the second magnetoelectric conversion element. The processing circuit unit obtains a differential output from the outputs of the first magnetoresistance segment and the second magnetoresistance segment.

In the magnetic position detecting device disclosed in the above-mentioned literature, a flux guide made of a magnetic material is further provided between the processing circuit unit and the magnet. The flux guide has a pair of protrusions facing each other and spaced apart from each other in the circumferential direction of the magnetic moving body. The second magnetoelectric conversion element is disposed approximately on the central line between the pair of protrusions. The first magnetoelectric conversion element is disposed on the side of one of the protrusions.

CITATION LIST

Patent Literature

PTL 1: Japanese Patent Laying-Open No. 2004-109113

SUMMARY OF INVENTION

Technical Problem

In the conventional magnetic position detecting device disclosed in the above-mentioned Japanese Patent Laying-Open No. 2004-109113 (PTL 1), each of two magnetoelectric conversion elements constituting a bridge circuit shows a resistance value that changes in accordance with the applied magnetic field. Therefore, the rotational position of the magnetic moving body can be detected by utilizing the characteristic that the resistance value of the magnetoelectric conversion element is different between the time when each magnetoelectric conversion element faces the protrusion of the magnetic moving body and the time when the each magnetoelectric conversion element faces the recess of the magnetic moving body.

In order to achieve a desired signal output from the bridge circuit even when the distance between the magnetic moving body and the magnetic position detecting device is relatively great, it is necessary to increase the difference of the magnetic field applied to the magnetoelectric conversion element between the time when the magnetoelectric conversion element faces the protrusion of the magnetic moving body and the time when the magnetoelectric conversion element faces the recess of the magnetic moving body. Furthermore, since the magnetoelectric conversion element such as an MR element, a GMR element and a TMR element shows sensitivity that is relatively high in the specific magnetic field region, it is necessary to cause each magnetoelectric conversion element to operate in the optimal magnetic field region.

However, in the conventional magnetic position detecting device, even if the arrangement of the magnetoelectric conversion element, the magnet and the flux guide is adjusted, there are limitations on improvements in the detection sensitivity of the magnetic position detecting device. For example, when all of the magnetoelectric conversion elements on the same substrate face the recess of the magnetic moving body, it is desirable to equally apply a certain desirable magnetic field to all of these magnetoelectric conversion elements. The arrangement for such an optimal magnetic field is, however, limited to a very narrow range. Even if such an optimal magnetic field distribution is achieved when each magnetoelectric conversion element faces the recess of the magnetic moving body, it is also extremely difficult to increase the difference of the magnetic field applied to each magnetoelectric conversion element between the time when each magnetoelectric conversion element faces the protrusion of the magnetic moving body and the time when each magnetoelectric conversion element faces the recess of the magnetic moving body.

In the magnetic position detecting device in the above-mentioned Japanese Patent Laying-Open No. 2004-109113 (PTL 1), the position of the magnetoelectric conversion element is adjusted in the state where the arrangement of the magnet and the flux guide is fixed, thereby optimizing the difference between the magnetic field applied to each magnetoelectric conversion element when each magnetoelectric conversion element faces the recess of the magnetic moving body and the magnetic field applied to two magnetoelectric conversion elements when one of the magnetoelectric conversion elements faces the protrusion of the magnetic moving body. However, it is difficult to independently adjust the magnetic field applied to each magnetoelectric conversion element when each element faces the recess of the magnetic moving body and the magnetic field applied to each magnetoelectric conversion element when each element faces the protrusion of the magnetic moving body. Accordingly, there are limitations on improvements in the detection sensitivity of the magnetic position detecting device by the conventional technique.

An object of the present invention is to raise the detection sensitivity of the magnetic position detecting device as compared with the conventional case.

Solution to Problem

In summary, the present invention provides a magnetic position detecting device including a magnet generating a magnetic field, first and second magnetoelectric conversion elements, a detection circuit, and a flux guide. Each of the first and second magnetoelectric conversion elements is provided on a first virtual plane and has a resistance value that changes in accordance with a change in the magnetic field caused by movement of a magnetic moving body. The detection circuit detects movement of the magnetic moving body based on the change in the resistance value of each of the first and second magnetoelectric conversion elements. The flux guide is made of a magnetic material and disposed between the magnet and the first and second magnetoelectric conversion elements. The flux guide includes first and second protrusions arranged spaced apart from each other in a first direction parallel to the first virtual plane, and a center portion. Each of the first and second protrusions protrudes in a direction toward the first virtual plane with respect to other portions of the flux guide. The center portion is provided in a mid-portion between the first protrusion and the second protrusion as seen in a second direction perpendicular to the first virtual plane. The first magnetoelectric conversion element is provided approximately in the mid-portion between the first protrusion and the second protrusion so as to cover a part of the center portion, as seen in the second direction. The second magnetoelectric conversion element is provided between the first magnetoelectric conversion element and the first protrusion so as to cover a part of the flux guide other than the center portion, as seen in the second direction. The center portion is different in shape or material from the portion of the flux guide other than the center portion between the first protrusion and the second protrusion such that a change in a component of a magnetic field parallel to the first virtual plane in a position of the first magnetoelectric conversion element is greater than a change in the component of the magnetic field parallel to the first virtual plane in a position of the second magnetoelectric conversion element when the magnetic moving body moves.

Advantageous Effects of Invention

According to the present invention, a center portion is provided that is different in shape or material from other portions of the flux guide between the first protrusion and the second protrusion such that the change in the component of the magnetic field parallel to the first virtual plane in the position of the first magnetoelectric conversion element is greater than the change in the component of the magnetic field parallel to the first virtual plane in the position of the second magnetoelectric conversion element when the magnetic moving body moves. Consequently, the detection sensitivity of the magnetic position detecting device can be enhanced as compared with the conventional case.

DESCRIPTION OF EMBODIMENTS

Figure 1:
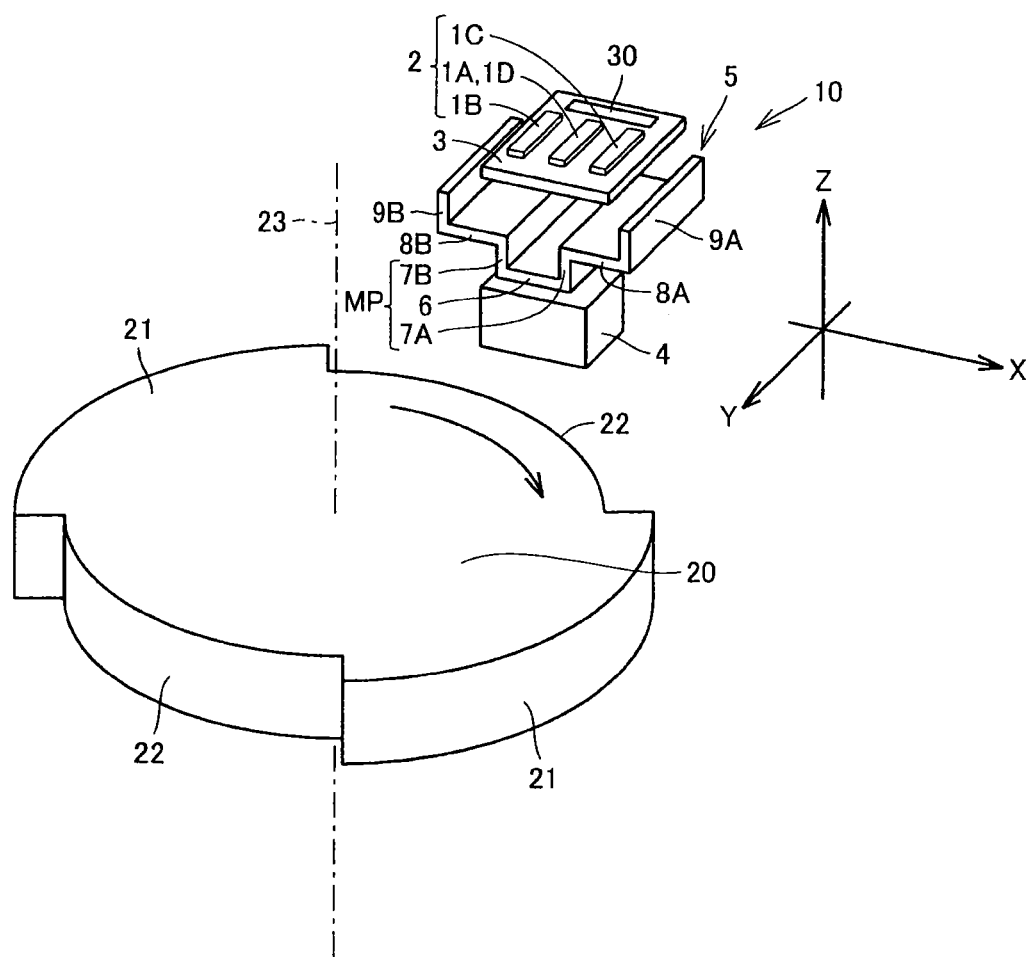
FIG. 1 is a perspective view of a magnetic position detecting device 10 according to the first embodiment of the present invention.

Embodiments of the present invention will be hereinafter described in detail with reference to the accompanying drawings, in which the same or corresponding components are designated by the same reference characters, and description thereof will not be repeated.

First Embodiment

Configuration of Magnetic Position Detecting Device

FIG. 1 is a perspective view of a magnetic position detecting device 10 according to the first embodiment of the present invention.

Figure 2:
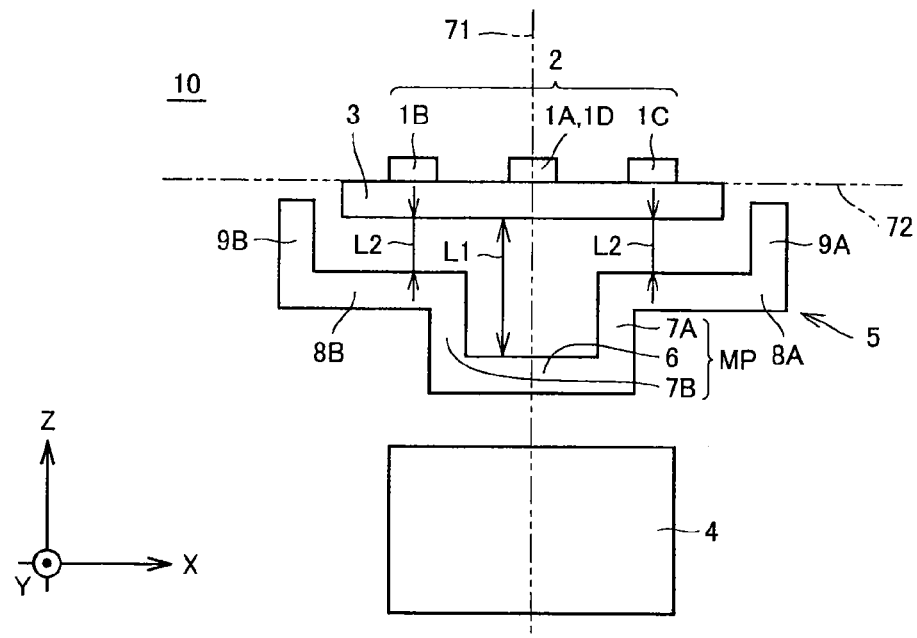
FIG. 2 is a side view of magnetic position detecting device 10 in FIG. 1.

FIG. 2 is a side view of magnetic position detecting device 10 in FIG. 1. Referring to FIGS. 1 and 2, a magnetic moving body 20 is an approximately disc-shaped magnetic body that rotates around a rotation axis (central axis) 23. Magnetic moving body 20 has a peripheral edge portion provided with a plurality of (two in the figure) radially protruding protrusions 21. The portion in the peripheral edge portion of magnetic moving body 20 located between protrusions 21 is referred to as a recess 22.

In order to detect the position of protrusion 21 of magnetic moving body 20, magnetic position detecting device 10 is disposed at a prescribed distance from magnetic moving body 20 as seen in the direction of rotation axis 23. The direction of rotation axis 23 of magnetic moving body 20 will be hereinafter referred to as a Z-axis direction. Based on the position of magnetic position detecting device 10, the direction extending in the rotational direction (circumferential direction) of magnetic moving body 20 is referred to as an X-axis direction while the radial direction of magnetic moving body 20 is referred to as a Y-axis direction. In order to distinguish the orientation along the Z-axis direction, positive and negative signs are attached such as a "+Z direction" and a "−Z direction". The same also applies to the X-axis direction and the Y-axis direction.

Magnetic position detecting device 10 includes a substrate 3, a bridge circuit 2, a detection circuit 30, a magnet 4, and a flux guide 5. Bridge circuit 2 has first to fourth magnetoelectric conversion elements 1A to 1D formed on substrate 3. At least a part of detection circuit 30 is formed on substrate 3. FIGS. 1 and 2 each schematically show positions of first to fourth magnetoelectric conversion elements 1A to 1D and detection circuit 30. Components in magnetic position detecting device 10 will be hereinafter sequentially described.

(1. Substrate)

Substrate 3 is disposed in parallel to the XY plane and extends orthogonal to the direction of rotation axis 23 of magnetic moving body 20 (Z-axis direction). Substrate 3 may be any type of substrate as long as it can be formed by integrating an electric circuit, and, for example, may be an Si (silicon) substrate commonly used for integrating an MOS (Metal-Oxide Semiconductor) transistor and a bipolar transistor. Alternatively, substrate 3 may be a GaAs (gallium arsenide) substrate or an SiC (silicon carbide) substrate having high heat resistance.

(2. Magnet)

Magnet 4 applies a magnetic field to first to fourth magnetoelectric conversion elements 1A to 1D and also applies a magnetic field to magnetic moving body 20. In the case of the first embodiment, magnet 4 having an approximately rectangular parallelepiped shape is magnetized approximately in the direction of rotation axis 23 of magnetic moving body 20 (Z-axis direction) and disposed such that two sides of magnet 4 extend approximately parallel to the X-axis direction and the Y-axis direction, respectively, as seen in the Z-axis direction. Magnet 4 may be of any type, shape and size as long as it can generate the operation magnetic field range and the magnetic flux density which are suitable for magnetoelectric conversion elements 1A to 1D. Examples of the type of magnet 4 may include a bond magnet, an iron-based magnet, a ferrite magnet, a rare-earth magnet, and an amorphous metal magnet. More specifically, magnet 4 may be any one of CoFe (cobalt-iron), SmCo (samarium cobalt), NdFeB (neodymium-iron-boron), CoFeB (cobalt-iron-boron), and the like.

(3. Flux Guide)

Flux guide 5 is provided between substrate 3 and magnet 4 in order to adjust the magnetic flux from magnet 4. The magnetic field applied to each of magnetoelectric conversion elements 1A to 1D depends on the type, the shape and the size of the magnet as well as the shape and the size of flux guide 5. The flux guide may be made of any material as long as it is a soft magnetic material having high saturation permeability, for example, Fe (iron), Co (cobalt), Ni (nickel), or an alloy thereof. In this case, Fe is suitable.

In magnetic position detecting device 10, the distribution of the magnetic flux in the vicinity of magnetoelectric conversion elements 1A to 1D is optimally adjusted by advantageously modifying the shape of flux guide 5. The features of the shape of flux guide 5 in the first embodiment will be hereinafter described.

First, assuming that a virtual plane 71 perpendicular to the X-axis direction is defined, flux guide 5 is provided with protrusions 9A and 9B in positions symmetrical with respect to this virtual plane 71. Assuming that a virtual plane 72 extending from one surface of substrate 3 is defined, protrusions 9A and 9B protrude toward this virtual plane 72 with respect to other portions of flux guide 5.

Secondly, a portion recessed in a concave shape (6, 7A, 7B) is provided in the mid-portion between protrusions 9A and 9B. The distance (L1 in FIG. 2) along the Z-axis direction between substrate 3 and the bottom of the recessed concave portion (which will be also referred to as a center portion MP) is longer than the distance (L2 in FIG. 2) along the Z-axis direction between substrate 3 and the portion of flux guide 5 located closer to each of protrusions 9A and 9B.

For flux guide 5 having the above-described shape, each of magnetoelectric conversion elements 1A and 1D covers a part of center portion MP (6, 7A, 7B) recessed in a concave shape as seen in the Z-axis direction. Preferably, each of magnetoelectric conversion elements 1A and 1D is provided in the position in proximity to virtual plane 71 (in the mid-portion between protrusions 9A and 9B as seen in the Z-axis direction). Magnetoelectric conversion element 1B is provided so as to cover a part of flux guide 5 located between protrusion 9B and center portion MP (6, 7A, 7B) recessed in a concave shape, as seen in the Z-axis direction. Magnetoelectric conversion element 1C is provided so as to cover a part of flux guide 5 located between protrusion 9A and center portion MP (6, 7A, 7B) recessed in a concave shape, as seen in the Z-axis direction.

Further preferably, flux guide 5 has a shape symmetrical with respect to virtual plane 71 while magnetoelectric conversion elements 1B and 1C are provided in positions symmetrical with respect to virtual plane 71. Preferably, the center of the magnetic pole of magnet 4 is located on virtual plane 71.

The shape of flux guide 5 in each of FIGS. 1 and 2 is shown as an example that satisfies the above-described features. Specifically, flux guide 5 consists of plate-shaped portions 6, 7A, 7B, 8A, 8B, 9A, and 9B each having a rectangular shape.

Plate-shaped portion 6 is parallel to substrate 3 and arranged in reflectional symmetry with respect to virtual plane 71. As seen in the Z-axis direction, each side of plate-shaped portion 6 is disposed to extend in the X-axis direction or the Y-axis direction. As shown in FIG. 2, the distance in the Z-axis direction between plate-shaped portion 6 and substrate 3 is L1.

Plate-shaped portions 7A and 7B are connected to both ends, respectively, in the X-axis direction of plate-shaped portion 6. Each of plate-shaped portions 7A and 7B extends at a right angle to plate-shaped portion 6 toward virtual plane 72. Plate-shaped portions 7A and 7B are arranged in reflectional symmetry to each other with respect to virtual plane 71.

Plate-shaped portion 8A is connected at a right angle to the end of plate-shaped portion 7A on the side closer to virtual plane 72, and extends parallel to substrate 3 in the direction away from plate-shaped portion 6. Plate-shaped portion 8B is connected at a right angle to the end of plate-shaped portion 7B on the side closer to virtual plane 72, and extends parallel to substrate 3 in the direction away from plate-shaped portion 6. Plate-shaped portions 8A and 8B are arranged in reflectional symmetry with respect to virtual plane 71. The distance in the Z-axis direction between substrate 3 and each of plate-shaped portions 8A and 8B is L2 (L2<L1).

Plate-shaped portion 9A corresponding to protrusion 9A is connected at a right angle to the end of plate-shaped portion 8A on the side opposite to plate-shaped portion 6, and extends toward virtual plane 72. Plate-shaped portion 9B corresponding to protrusion 9B is connected at a right angle to the end of plate-shaped portion 8B on the side opposite to plate-shaped portion 6, and extends toward virtual plane 72. Plate-shaped portions 9A and 9B are arranged in reflectional symmetry with respect to virtual plane 71.

Each of magnetoelectric conversion elements 1A and 1D is disposed so as to cover a part of plate-shaped portion 6 and cross virtual plane 71 as seen in the Z-axis direction (that is, approximately in the mid-portion between plate-shaped portions 7A and 7B as seen in the Z-axis direction). Magnetoelectric conversion elements 1B and 1C are disposed so as to cover parts of plate-shaped portions 8B and 8A, respectively, as seen in the Z-axis direction (that is, magnetoelectric conversion element 1B is disposed between plate-shaped portions 7B and 9B while magnetoelectric conversion element 1C is disposed between plate-shaped portions 7A and 9A). Preferably, the centers of magnetoelectric conversion elements 1A to 1D are aligned in the X-axis direction, in which the distance in the X-axis direction from magnetoelectric conversion elements 1A and 1D to magnetoelectric conversion element 1B is equal to the distance from magnetoelectric conversion elements 1A and 1D to magnetoelectric conversion element 1C. In other words, magnetoelectric conversion elements 1B and 1C are disposed in positions symmetrical to each other with respect to virtual plane 71.

As shown in FIG. 2, the center of the magnetic pole of magnet 4 is located in the mid-portion of plate-shaped portion 6 in the X-axis direction (on virtual plane 71) as seen in the Z-axis direction. As seen in the Z-axis direction, the center of the magnetic pole of magnet 4 is displaced by a prescribed distance from exactly the midpoint of plate-shaped portion 6 in the Y-axis direction.

The shape of flux guide 5 in each of FIGS. 1 and 2 can also be shown as a rectangular plate-shaped member bent in the width direction at a plurality of portions in the longitudinal direction thereof. Specifically, a rectangular plate-shaped member is first adjusted such that its longitudinal direction is aligned in the X-axis direction and its width direction is aligned in the Y-axis direction. Then, the plate-shaped member is bent at 90° in the +Z direction at each position at a prescribed distance from the midpoint in the longitudinal direction to each end. Then, the plate-shaped member is bent again at 90° in the direction away from the midpoint in the longitudinal direction at each prescribed position from each bent position to each end in the longitudinal direction. Furthermore, the plate-shaped member is bent again at 90° in the +Z direction at each prescribed position from each of the second bent positions to each end in the longitudinal direction. Consequently, plate-shaped portions 6, 7A, 7B, 8A, 8B, 9A, and 9B are sequentially formed.

(4. Magnetoelectric Conversion Element)

Figure 3:
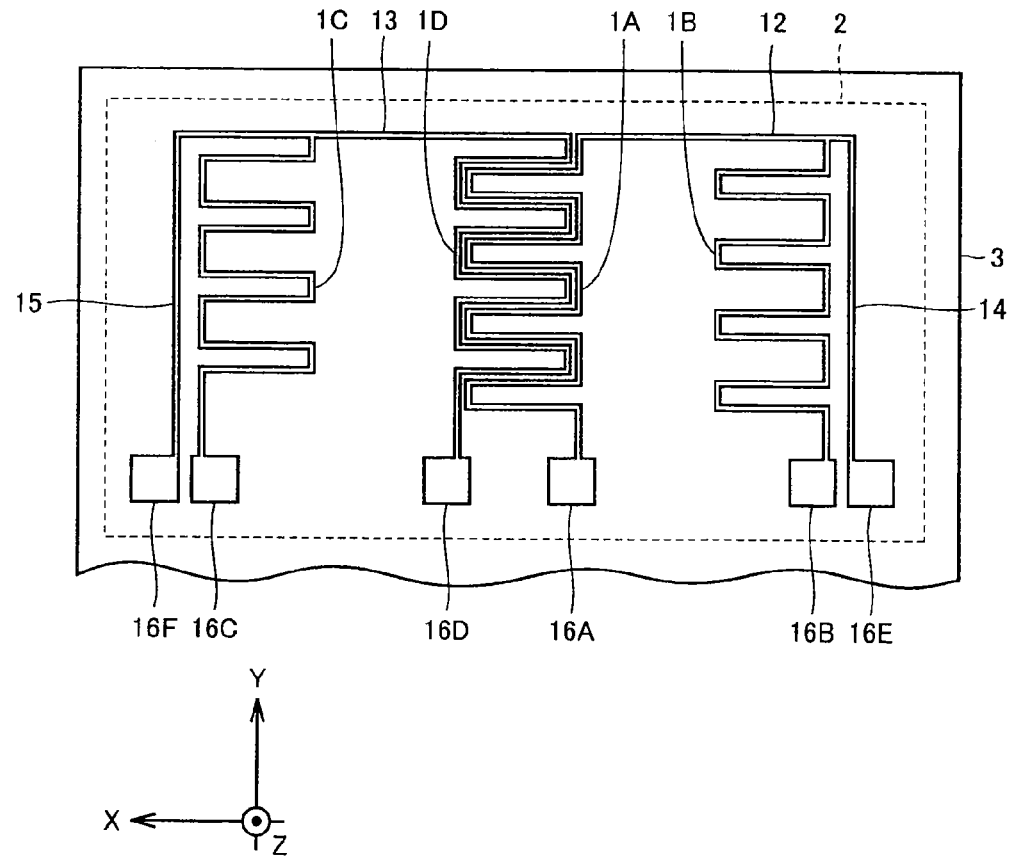
FIG. 3 is a plan view showing an example of the arrangement of first to fourth magnetoelectric conversion elements 1A to 1D in FIG. 1.

FIG. 3 is a plan view showing an example of the arrangement of first to fourth magnetoelectric conversion elements 1A to 1D in FIG. 1.

As magnetoelectric conversion elements 1A to 1D, such a device as having sensitivity to the magnetic field in the in-plane direction of the substrate having each element formed therein (in the XY in-plane direction in FIGS. 1 and 2) can be applied. FIG. 3 shows an example in which an MR element, a GMR element having an artificial lattice structure or a spin valve type GMR element is applied as magnetoelectric conversion elements 1A to 1D. A TMR element is also applicable in place of these elements. The example using the TMR element will be described later with reference to FIGS. 12 to 15. In the case of the GMR element among the above-mentioned magnetoelectric conversion elements, the component of the magnetic field in the direction perpendicular to the substrate having elements formed thereon is less influential while the resistance of the element varies mainly by the magnitude and the direction of the component of the magnetic field in the in-plane of the substrate having elements formed thereon. Accordingly, the GMR element is suitable as a magnetoelectric conversion element for magnetic position detecting device 10.

The MR element is obtained by processing a magnetic thin film of several angstroms to hundreds of angstroms, for example, to be in a linear shape as shown in FIG. 3. In the MR element, the resistance changes in proportional approximately to $\sin 2\theta$ with respect to an angle $\theta$ formed between the orientation of the current flowing through each point in the linear pattern and the orientation of the component of the magnetic field applied to each point in the in-plane direction of the substrate.

In FIG. 3, each of magnetoelectric conversion elements 1A to 1D is formed by a meander interconnection. The meander interconnection forming magnetoelectric conversion element 1A and the meander interconnection forming magnetoelectric conversion element 1D are disposed in parallel to each other. The ends of magnetoelectric conversion elements 1A to 1D in the −Y direction are connected to pads 16A to 16D, respectively, formed on substrate 3. The ends of magnetoelectric conversion elements 1A and 1B in the +Y direction are connected to each other through an interconnection 12 and also connected to a pad 16E through an interconnection 14. The ends of magnetoelectric conversion elements 1C and 1D in the +Y direction are connected to each other through an interconnection 13 and also connected to a pad 16F through an interconnection 15.

The GMR element having an artificial lattice structure is obtained by processing a stacked body formed by alternately stacking a magnetic thin film and a non-magnetic thin film each having a thickness of several angstroms to tens of angstroms, that is, the so-called artificial lattice film, for example, to be in a linear shape as shown in FIG. 3. Known as an artificial lattice film are (Fe/Cr)n, (permalloy/Cu/Co/Cu)n, (Co/Cu) and the like (n represents the number of stacks, Cu represents copper, and Cr represents chromium). In the GMR element, the element resistance varies in accordance with the component of the applied magnetic field in the in-plane of the substrate having each element formed thereon. It is known that the GMR element has an MR effect that is significantly great as compared with the MR element. Therefore, since a relatively great resistance change is achieved with respect to the amount of change in the same magnetic field, the SN ratio of the magnetic position detecting device can be improved while noise immunity can be enhanced.

The spin valve type GMR element is a stacked body having such a structure as including an antiferromagnetic film/a ferromagnetic film (1)/a non-magnetic film/a ferromagnetic film (2). The ferromagnetic film (1) is referred to as a fixed layer since its magnetization direction is fixed in a desired direction by the antiferromagnetic film adjacent thereto. The ferromagnetic film (2) is referred to as a free layer since its magnetization direction changes in accordance with the direction of the external magnetic field. Specifically, in order to form the structure in FIG. 3, a stacked film such a structure of Ta (tantalum)/NiFe (nickel-iron)/IrMn (iridium-manganese)/ CoFe/Cu/CoFe/Ta is formed on the substrate. The formed stacked film is processed to be in a linear shape as shown in FIG. 3 by commonly used photolithography and ion beam etching.

Assuming that the angle formed between the fixed layer and the free layer is θ, a resistance R of the spin valve type GMR element changes in proportion to cos θ, as represented below.

$$R = Ro + \Delta R \cdot \cos \theta \qquad (1)$$

In this case, Ro and ΔR each are a constant.

It is preferable that the angle formed between the magnetization direction of the fixed layer and the direction of the magnetic field applied to each magnetoelectric conversion element (spin valve GMR element) is greatly different between the time when each magnetoelectric conversion element faces protrusion 21 of magnetic moving body 20 and the time when each magnetoelectric conversion element faces recess 22 of magnetic moving body 20. For example, it is only necessary to set the orientation of magnetization of the fixed layer of each magnetoelectric conversion element to be in the X-axis direction, minimize the component in the Y-axis direction of the magnetic field applied to each magnetoelectric conversion element (spin valve GMR element) at the time when each magnetoelectric conversion element faces recess 22 of magnetic moving body 20, and maximize the component in the Y-axis direction at the time when each magnetoelectric conversion element faces protrusion 21.

(5. Detection Circuit)

Figure 4:
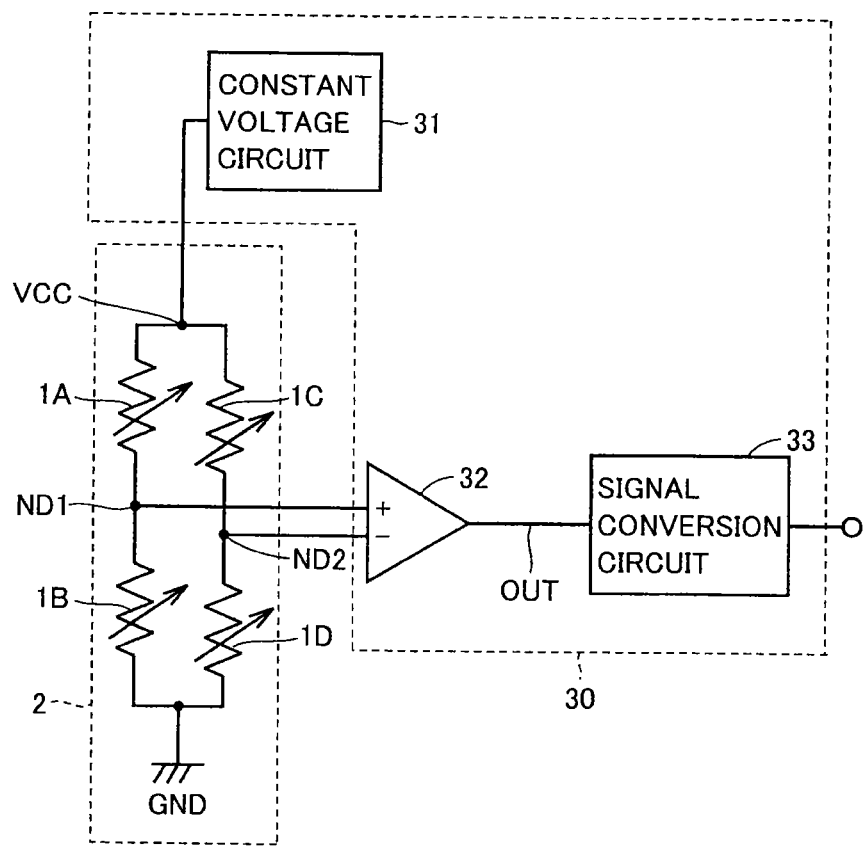
FIG. 4 is a circuit diagram of a bridge circuit 2 and a detection circuit 30 in FIG. 1.

FIG. 4 is a circuit diagram of bridge circuit 2 and detection circuit 30 in FIG. 1.

Referring to FIG. 4, magnetoelectric conversion elements 1A and 1B are connected in this order in series to each other between a power supply node VCC (the first power supply node) and a ground node GND (the second power supply node). Magnetoelectric conversion elements 1C and 1D are connected in this order in series to each other between power supply node VCC and ground node GND and also connected in parallel to a series-connected body of magnetoelectric conversion elements 1A and 1B. In the plan view in FIG. 3, pads 16A and 16C are connected to power supply node VCC while pads 16B and 16D are connected to ground node GND.

Detection circuit 30 serves to detect movement of magnetic moving body 20 based on the output from bridge circuit 2. Detection circuit 30 includes a constant voltage circuit 31, a differential amplifier circuit 32 and a signal conversion circuit 33. Constant voltage circuit 31 applies a constant voltage to power supply node VCC of bridge circuit 2. Differential amplifier circuit 32 amplifies the difference voltage between the voltage on a connection node ND1 of magnetoelectric conversion elements 1A and 1B and the voltage on a connection node ND2 of magnetoelectric conversion elements 1C and 1D. Connection node ND1 corresponds to pad 16E in FIG. 3 while connection node ND2 corresponds to pad 16F in FIG. 3. The resistance value of each magnetoelectric conversion element changes in accordance with rotation of magnetic moving body 20, and this change in the resistance value is detected as a change in the voltage between connection nodes ND1 and ND2.

Signal conversion circuit 33 converts the output voltage from differential amplifier circuit 32 into a desired output signal. For example, by using a comparator for an appropriately determined reference potential, a high level ("1") signal and a low level ("0") signal corresponding to protrusion 21 and recess 22, respectively, of magnetic moving body 20 can be generated.

It is preferable that at least a part of constant voltage circuit 31, differential amplifier circuit 32 and signal conversion circuit 33 constituting detection circuit 30, for example, differential amplifier circuit 32, is provided on the same substrate 3 on which magnetoelectric conversion elements 1A to 1D are provided. More preferably, as shown in FIG. 1, every detection circuit 30 is provided on substrate 3. Bridge circuit 2 and detection circuit 30 are provided on the same substrate 3, thereby allowing implementation of magnetic position detecting device 10 having a high SN (Signal-to-Noise) ratio and high noise immunity.

Operation of Magnetic Position Detecting Device (1. Basic Principle—in the Case where No Flux Guide is Provided)

Figure 5:
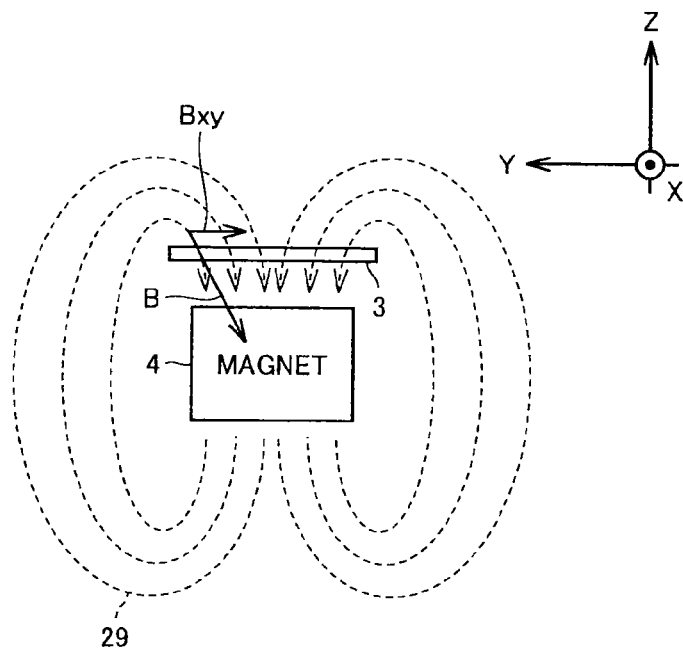
FIG. 5 is a diagram for illustrating the basic principle of magnetic position detecting device 10.
Figure 5:
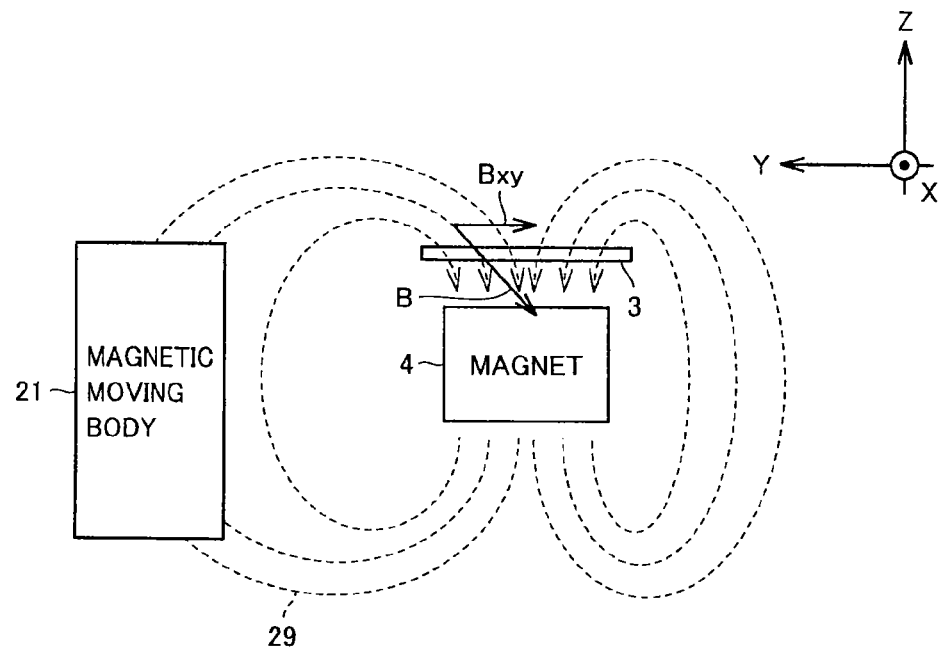

FIG. 5 is a diagram for illustrating the basic principle of magnetic position detecting device 10. FIG. 5(A) shows the distribution of magnetic lines of force 29 generated by magnet 4 at the time when magnetic position detecting device 10 faces recess 22 of magnetic moving body 20. FIG. 5(B) shows the distribution of magnetic lines of force 29 generated by magnet 4 at the time when magnetic position detecting device 10 faces protrusion 21 of magnetic moving body 20. Referring to FIGS. 5(A) and (B), an explanation will be hereinafter given with regard to the principles of detecting the position of magnetic moving body 20 by magnetic position detecting device 10 in the most basic case where flux guide 5 is not provided in magnetic position detecting device 10.

Magnet 4 is magnetized approximately perpendicular (in the Z-axis direction) to substrate 3. Accordingly, when magnetic position detecting device 10 does not face protrusion 21 of magnetic moving body 20 as shown in FIG. 5(A), the magnetic field emitted from magnet 4 shows a component orthogonal to substrate 3 that is greater than the component parallel to substrate 3. In other words, magnetic lines of force 29 cross substrate 3 at an angle nearly perpendicular to substrate 3.

On the other hand, when magnetic position detecting device 10 faces protrusion 21 of magnetic moving body 20 as shown in FIG. 5(B), magnetic lines of force 29 flowing into magnetic moving body 20 are increased, which causes a decrease in the angle formed between the magnetic field and substrate 3. In this case, the magnitude |B| of the magnetic field is not so changed while the magnitude |Bxy| of the component parallel to substrate 3 is increased. In other words, the magnitude |Bxy| of the component, parallel to substrate 3, of the magnetic field applied to the magnetoelectric conversion element formed on substrate 3 is increased when magnetic position detecting device 10 faces protrusion 21 of magnetic moving body 20 and decreased when magnetic position detecting device 10 faces recess 22 of magnetic moving body 20.

A magnetoelectric conversion element such as a GMR element has a characteristic that the electric resistance smoothly decreases in accordance with an increase in the magnetic field of a component parallel to substrate 3 having a magnetoelectric conversion element formed thereon. As a result, the resistance value of the magnetoelectric conversion element decreases when magnetic position detecting device 10 faces protrusion 21 of magnetic moving body 20. Magnetic position detecting device 10 detects this change in the resistance value as a change in the output of bridge circuit 2.

(2. Effects of Protrusions 9A and 9B of Flux Guide)

Figure 6:
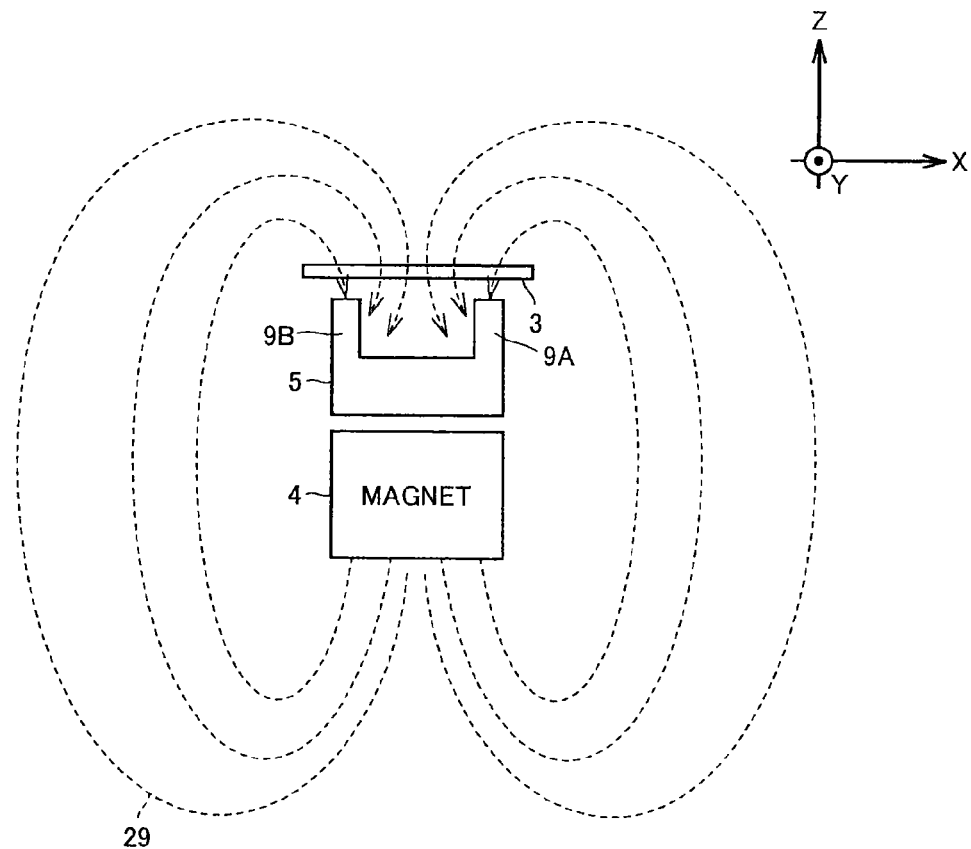
FIG. 6 is a diagram for illustrating the effects of protrusions 9A and 9B in flux guide 5.

FIG. 6 is a diagram for illustrating the effects of protrusions 9A and 9B of flux guide 5. FIG. 6 shows the case where flux guide 5 has protrusions 9A and 9B while the shape of flux guide 5 between protrusions 9A and 9B is flat (the case where a recessed concave portion is not provided).

Flux guide 5 used in magnetic position detecting device 10 is not so large as compared with the size of magnet 4 and is disposed in close proximity to magnet 4. In this case, the magnetic flux distribution is formed such that the magnetic flux emitted from the north pole of magnet 4 (on the side in the −Z direction in FIG. 6) is almost entirely incident on flux guide 5 and enters the south pole of the magnet through flux guide 5. Also in this case, since the flux guide has a specific magnetic permeability that is more than 1000 times as much as that of air, the magnetic flux tends to be distributed so as to flow through the flux guide as far as possible. As a result, the magnetic flux concentrates in protrusions 9A and 9B as shown in FIG. 6, so that the directions of the magnetic flux near the magnetoelectric conversion element are aligned as compared with the case where flux guide 5 is not provided. In this way, protrusions 9A and 9B of flux guide 5 serve to adjust the distribution of the magnetic flux incident on the south pole of the magnet as if its shape is changed by the south pole of the magnet.

(3. Effects by Shape Between Protrusions 9A and 9B of Flux Guide)

Figure 7:
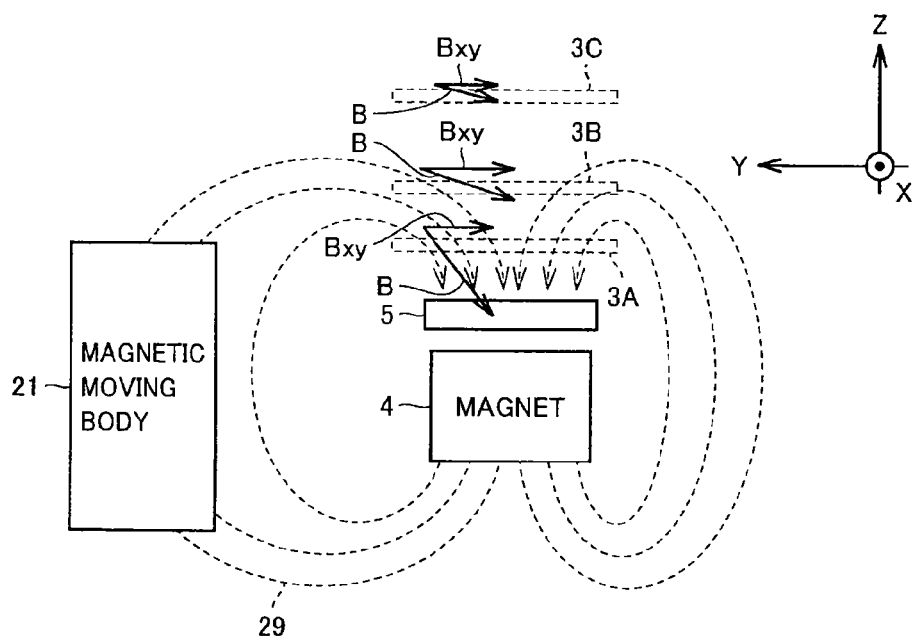
FIG. 7 is a diagram for illustrating the change in the direction of the magnetic field caused by the change in the distance between flux guide 5 and a substrate 3.

FIG. 7 is a diagram for illustrating the change in the direction of the magnetic field caused by the change in the distance between flux guide 5 and substrate 3. FIG. 7 shows the cases where substrate 3 having a magnetoelectric conversion element formed thereon is disposed at different distances from magnet 4 and flux guide 5 in the Z-axis direction (3A, 3B and 3C in FIG. 7). It is to be noted that FIG. 7 shows flux guide 5 in a simplified flat-plate shape.

There are characteristics described below in the relationship between the positions of magnetoelectric conversion elements 1A to 1D formed on substrate 3 and the magnitude of the magnetic field to be applied.

(1) The magnitude (|B|) of the magnetic field is decreased as substrate 3 is away from magnet 4 and flux guide 5.

(2) The change rate of the component of the magnetic field parallel to substrate 3 (component Bxy in the in-plane direction of the substrate) between the case where each magnetoelectric conversion element faces protrusion 21 of magnetic moving body 20 and the case where each magnetoelectric conversion element does not face protrusion 21 of magnetic moving body 20 is determined based on the relative relationship between a distance D1 from each magnetoelectric conversion element to magnetic moving body 20 and a distance D2 from each magnetoelectric conversion element to magnet 4 (flux guide 5). As distance D1 becomes shorter than distance D2, the change rate of component Bxy of the magnetic field associated with movement of magnetic moving body 20 is raised.

(3) The more substrate 3 is away from magnet 4 and flux guide 5 in the Z-axis direction, the more the proportion of component Bxy of the magnetic field parallel to substrate 3 with respect to the component of the magnetic field perpendicular to substrate 3 is increased (in other words, the angle formed between the direction of the magnetic field and the in-plane direction of the substrate is decreased).

(4) With regard to the magnetic field distribution near flux guide 5, the magnetic field is almost perpendicular to the plane of flux guide 5 in the flat portion while the direction of the magnetic field abruptly changes in the peripheral edge portion. Consequently, with regard to the direction of the magnetic field in substrate 3, the nearer the peripheral edge portion of flux guide 5 as seen in the Z-axis direction, the smaller the angle formed between the direction of the magnetic field and the substrate plane is.

Since it is considered in the case of FIG. 7 that distance D1 in the above-described characteristic (2) is not greatly changed as compared with distance D2, it is considered that the greater distance D2 between the magnetoelectric conversion element and magnet 4 (flux guide 5) is, the more the change rate of component Bxy of the magnetic field is increased. According to the above-described characteristic (1), however, the magnitude (|B|) of the magnetic field is decreased in accordance with an increase in distance D2. Therefore, it is considered that the amount of change in the magnitude of component Bxy of the magnetic field reaches the maximum when distance D2 is equal to a prescribed distance (in the case of 3B in FIG. 7).

Figure 8:
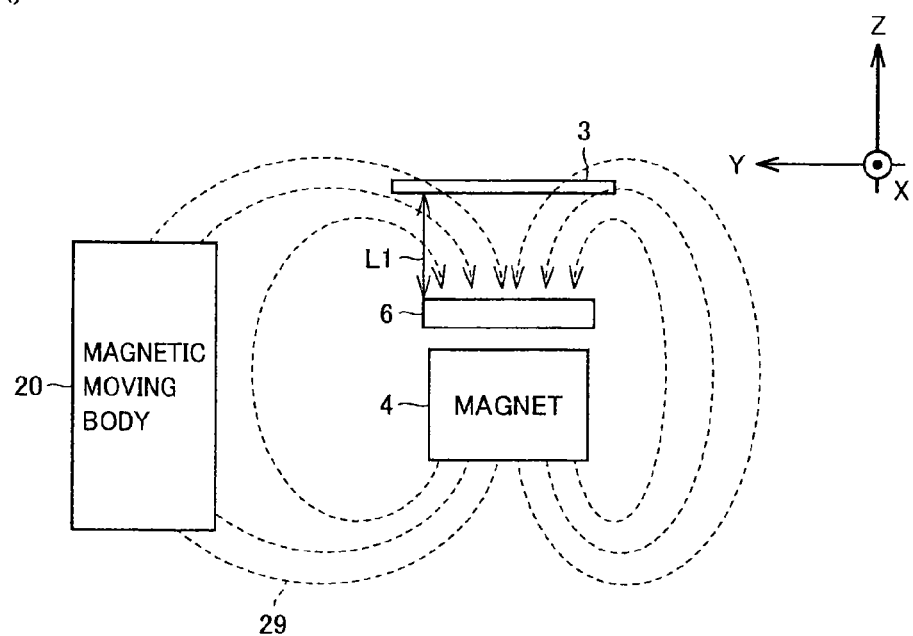
FIG. 8 is a diagram for illustrating the effects of a center portion MP (6, 7A, 7B) of flux guide 5 in the first embodiment.
Figure 8:
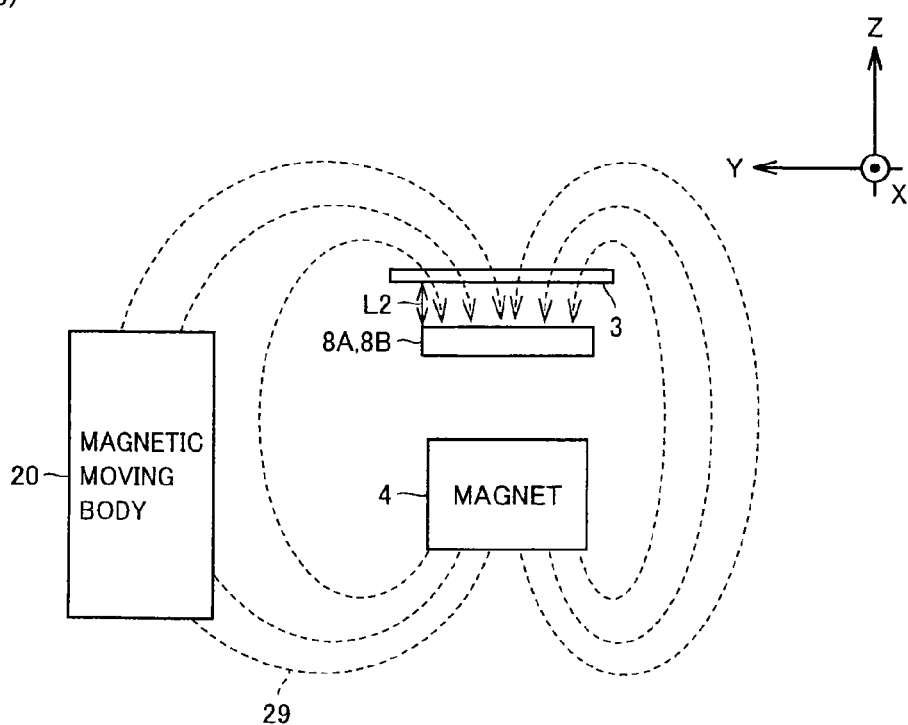

FIG. 8 is a diagram for illustrating the effects of center portion MP (6, 7A, 7B) of flux guide 5 in the first embodiment. FIG. 8(A) shows the relationship between plate-shaped portion 6 and magnetoelectric conversion elements 1A, 1D formed on substrate 3 in FIGS. 1 and 2. FIG. 8(B) shows the relationship between plate-shaped portions 8A, 8B and magnetoelectric conversion elements 1B, 1C formed on substrate 3 in FIGS. 1 and 2.

As shown in FIGS. 8(A) and (B), a distance L1 from magnetoelectric conversion elements 1A and 1D to the plane (plate-shaped portion 6) of flux guide 5 located closest thereto is longer than a distance L2 from magnetoelectric conversion elements 1B and 1C to the plane (plate-shaped portions 8B and 8A) of the flux guide located closest thereto. As explained in FIG. 7, component Bxy of the magnetic field parallel to substrate 3 reaches the maximum at a certain distance from flux guide 5 along the Z-axis direction. Accordingly, by appropriately selecting distances L1 and L2, the amount of variation in component Bxy of the magnetic field in the position of each of magnetoelectric conversion elements 1A and 1D can be set greater than the amount of variation in component Bxy of the magnetic field in the position of each of magnetoelectric conversion elements 1B and 1C.

The output of detection circuit 30 is determined by the amount of change in component Bxy of the magnetic field between the case where each magnetoelectric conversion element faces protrusion 21 of magnetic moving body 20 and the case where each magnetoelectric conversion element does not face protrusion 21 of magnetic moving body 20. Only by the above-described adjustment, a difference occurs between the magnitude of component Bxy of the magnetic field in the position of each of magnetoelectric conversion elements 1A and 1D, and the magnitude of component Bxy of the magnetic field in the position of each of magnetoelectric conversion elements 1B and 1C even when each magnetoelectric conversion element does not face protrusion 21 of magnetic moving body 20. Accordingly, this is not preferable as the configuration of the sensor. Thus, it is preferable to adjust the lengths of plate-shaped portions 7A and 7B in the Z-axis direction and the lengths of plate-shaped portions 6, 8A, and 8B in the X-axis direction, thereby making an adjustment such that components Bxy of the magnetic fields applied to magnetoelectric conversion elements become almost equal when the magnetoelectric conversion elements do not face protrusion 21 of magnetic moving body 20.

Figure 9:
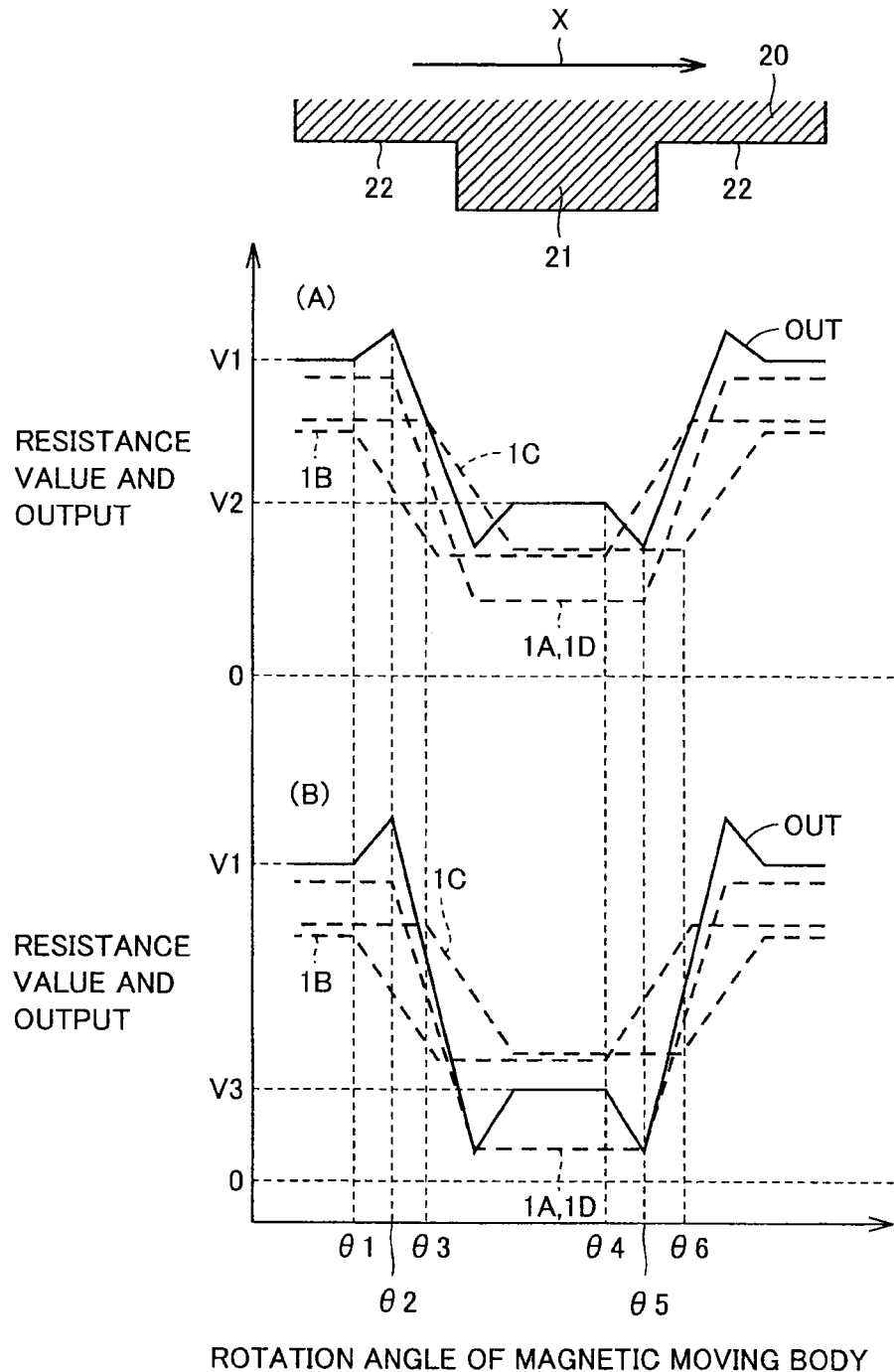
FIG. 9 is a diagram showing the change in the resistance value of each of magnetoelectric conversion elements 1A to 1D and the change in the output voltage of a differential amplifier circuit 32 which are caused by rotation of magnetic moving body 20.

FIG. 9 is a diagram showing the change in the resistance value of each of magnetoelectric conversion elements 1A to 1D and the change in the output voltage of differential amplifier circuit 32 which are caused by rotation of magnetic moving body 20. FIG. 9(A) is a comparative example showing the case where flux guide 5 is not provided with a portion recessed in a concave shape (the case where the region between protrusions 9A and 9B is flat). FIG. 9(B) shows the case of flux guide 5 in the first embodiment. The graphs represented by characters 1A to 1D show resistance values of magnetomagnetoelectric conversion elements 1A to 1D, respectively, while the graph represented by a character OUT shows an output voltage of differential amplifier circuit 32 in FIG. 4.

When the rotation angle of magnetic moving body 20 is θ1, magnetoelectric conversion element 1B is changed from the state where the element faces recess 22 of magnetic moving body 20 to the state where the element faces protrusion 21 of magnetic moving body 20. This causes an abrupt decrease in the resistance value of magnetoelectric conversion element 1B.

Then, at a rotation angle θ2, magnetoelectric conversion elements 1A and 1D are changed from the state where these elements face recess 22 of magnetic moving body 20 to the state where these elements faces protrusion 21 of magnetic moving body 20. This causes an abrupt decrease in the resistance value of each of magnetoelectric conversion elements 1A and 1D.

Then, at a rotation angle θ3, magnetoelectric conversion elements 1C is changed from the state where the element faces recess 22 of magnetic moving body 20 to the state where the element faces protrusion 21 of magnetic moving body 20. This causes an abrupt decrease in the resistance value of magnetoelectric conversion element 1C.

Then, at a rotation angle θ4, magnetoelectric conversion elements 1B is changed from the state where the element faces protrusion 21 of magnetic moving body 20 to the state where the element faces recess 22 of magnetic moving body 20. This causes an abrupt increase in the resistance value of magnetoelectric conversion element 1B.

Then, at a rotation angle θ5, magnetoelectric conversion elements 1A and 1D are changed from the state where these elements face protrusion 21 of magnetic moving body 20 to the state where these elements face recess 22 of magnetic moving body 20. This causes an abrupt increase in the resistance value of each of magnetoelectric conversion elements 1A and 1D.

Then, at a rotation angle θ6, magnetoelectric conversion element 1C is changed from the state where the element faces protrusion 21 of magnetic moving body 20 to the state where the element faces recess 22 of magnetic moving body 20. This causes an abrupt increase in the resistance value of magnetoelectric conversion element 1C.

When comparing the case (A) in the comparative example with the case (B) in the first embodiment, an output voltage V1 of differential amplifier circuit 32 is approximately the same while magnetoelectric conversion elements 1A to 1D are facing recess 22 of magnetic moving body 20. In contrast, when magnetoelectric conversion elements 1A to 1D face protrusion 21 of magnetic moving body 20, the resistance values of magnetoelectric conversion elements 1A and 1D in the case (B) in the first embodiment are smaller than the resistance values of magnetoelectric conversion elements 1A and 1D in the case (A) in the comparative example. Consequently, an output voltage V3 of differential amplifier circuit 32 in the case (B) in the first embodiment is also smaller than an output voltage V2 of differential amplifier circuit 32 in the case (A) in the comparative example. In other words, it is found out that the change in the output of bridge circuit 2 caused by the movement of magnetic moving body 20 is greater in the case (B) in the first embodiment.

Furthermore, a recessed concave portion provided between protrusions 9A and 9B of flux guide 5 allows an operation in the magnetic field region suitable for the magnetoelectric conversion elements while maintaining a change in the output to be relatively great. For example, the magnitude and the direction of the magnetic field applied to each of magnetoelectric conversion elements 1A to 1D can be kept approximately the same in the state where magnetoelectric conversion elements 1A to 1D do not face protrusion 21 of magnetic moving body 20.

Figure 10:
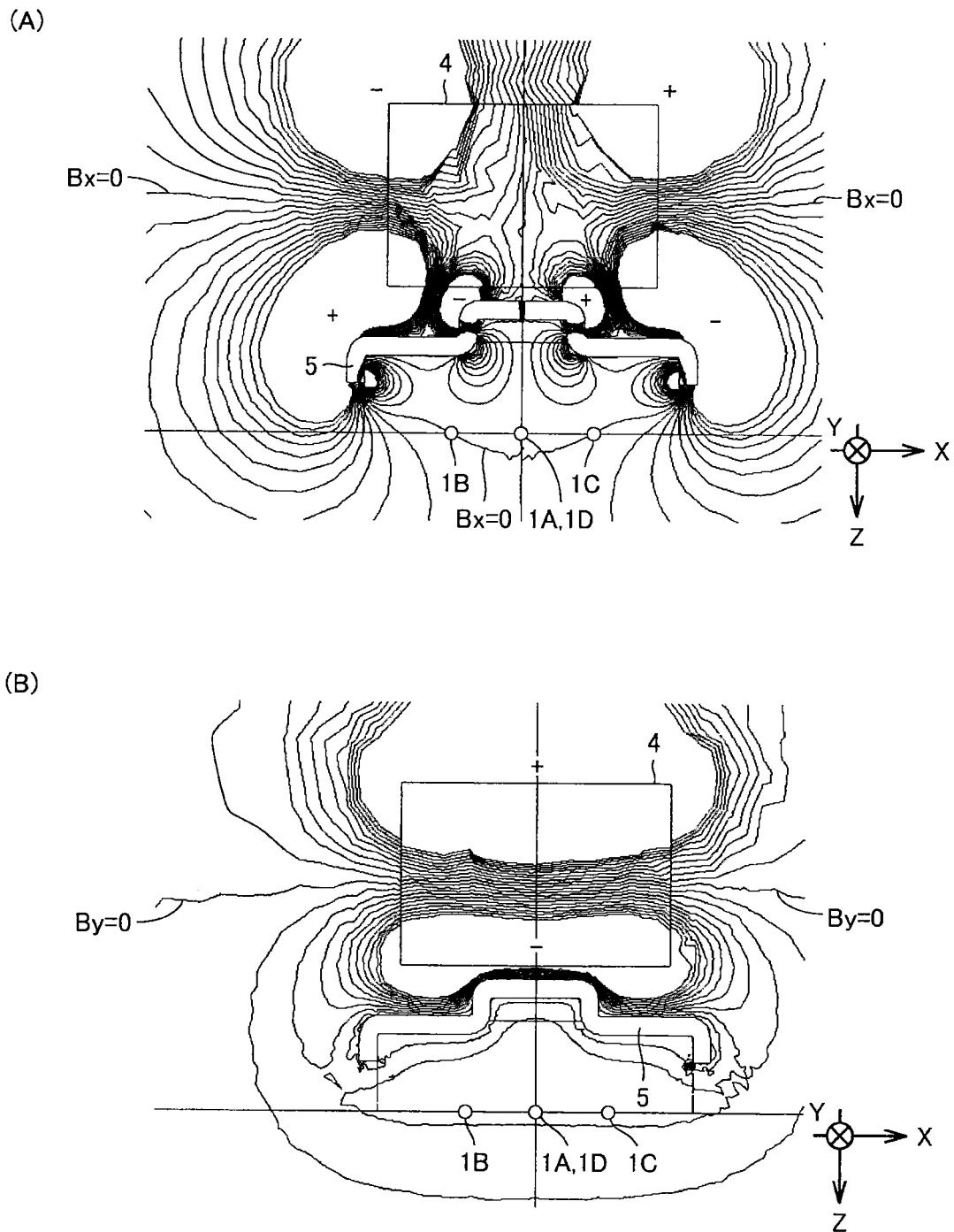
FIG. 10 is a diagram showing distribution of the magnetic field strength around magnetic position detecting device 10.

FIG. 10 is a diagram showing the distribution of the magnetic field strength around magnetic position detecting device 10. FIG. 10(A) shows a contour diagram of the distribution of a magnetic field Bx of magnetic position detecting device 10 in the X-axis direction. In FIG. 10(A), magnetic field Bx has an absolute value that reaches the maximum in a positive value near the position marked by a + (plus) sign and also has an absolute value that reaches the maximum in a negative value near the position marked by a − (minus) sign. FIG. 10(B) shows a contour diagram of the distribution of a magnetic field By of magnetic position detecting device 10 in the Y-axis direction. In FIG. 10(B), magnetic field By has an absolute value that reaches the maximum in a positive value near the position marked by a + (plus) sign and also has an absolute value that reaches the maximum in a negative value near the position marked by a − (minus) sign. Each figure shows a magnetic field distribution in the state where the magnetoelectric conversion elements do not face protrusion 21 of magnetic moving body 20.

As apparent from FIG. 10(A), component Bx of the magnetic field in the X-axis direction changes in the vicinity of plate-shaped portions 7A and 7B in FIG. 1, which is less influential to component By of the magnetic field in the Y-axis direction. Therefore, for example, magnetoelectric conversion elements 1A to 1D are disposed in positions shown by circles in the figure, thereby allowing the component of the magnetic field in the XY in-plane direction to be almost equal, and further allowing component Bx of the magnetic field in the X-axis direction to be approximately zero.

In this way, a concave portion is provided between protrusions 9A and 9B of flux guide 5. Accordingly, in the state where magnetoelectric conversion elements 1A to 1D do not face protrusion 21 of magnetic moving body 20, components Bx and By of the magnetic field in positions of magnetoelectric conversion elements 1A to 1D can be set as a magnetic field region suitable for the operation of each magnetoelectric conversion element while maintaining a change in the output to be relatively great.

Summary of Effects of Flux Guide 5

The effects of the flux guide structure in the first embodiment will be hereinafter summarized. The first characteristic of the structure of flux guide 5 lies in that a pair of protrusions 9A and 9B (plate-shaped portions 9A and 9B) are provided. Since the magnetic flux generated from magnet 4 is concentrated in protrusions 9A and 9B, the directions of the magnetic fluxes near the magnetoelectric conversion element can be aligned as compared to the case where flux guide 5 is not provided.

The second characteristic of the structure of flux guide 5 lies in that a portion recessed in a concave shape (which will be also referred to as a center portion MP) is provided in the mid-portion between protrusions 9A and 9B. Consequently, while setting the magnetic field distribution in each position of magnetoelectric conversion elements 1A to 1D as a desired distribution in the state where magnetoelectric conversion elements 1A to 1D face recess 22 of magnetic moving body 20, it becomes possible to increase the amount of change in the component of the magnetic field in the direction parallel to substrate 3 in each position of magnetoelectric conversion elements 1A and 1D in the state where these magnetoelectric conversion elements face protrusion 21.

When flux guide 5 is provided only with protrusions 9A and 9B but not with center portion MP recessed in a concave shape, it is necessary to adjust the positions of magnetoelectric conversion elements 1A to 1D in order to maximize the output of bridge circuit 2. In this case, however, the distance between magnetoelectric conversion elements 1A to 1D and protrusions 9A, 9B also changes, which causes the magnetic field applied to magnetoelectric conversion elements 1A to 1D to be displaced from the optimal operation range.

On the other hand, in the case of magnetic position detecting device 10 in the first embodiment, the positions of magnetoelectric conversion elements 1A to 1D are adjusted such that the magnetic field applied to magnetoelectric conversion elements 1A to 1D at the time when magnetoelectric conversion elements 1A to 1D face recess 22 of magnetic moving body 20 fall within the optimal operation range of magnetoelectric conversion elements 1A to 1D. By optimizing distances L1 and L2 in FIG. 2 in this adjusted state, magnetoelectric conversion elements 1A to 1D can be adjusted so as to maximize the change in the output of bridge circuit 2 caused by movement of magnetic moving body 20.

In this way, in magnetic position detecting device 10 according to the first embodiment, while keeping the magnetic field region in which each of magnetoelectric conversion elements 1A to 1D operates to fall within the optimal range, it becomes possible to increase the change in the output voltage of bridge circuit 2 that is caused by the change from the state where the magnetoelectric conversion elements face protrusion 21 of magnetic moving body 20 to the state where the magnetoelectric conversion elements face recess 22 of magnetic moving body 20. Consequently, even when the distance between magnetic position detecting device 10 and magnetic moving body 20 is so great that the conventional magnetic position detecting device cannot detect, it is possible to distinguish whether the magnetoelectric conversion elements face protrusion 21 or recess 22.

First Modification of First Embodiment

Figure 11:
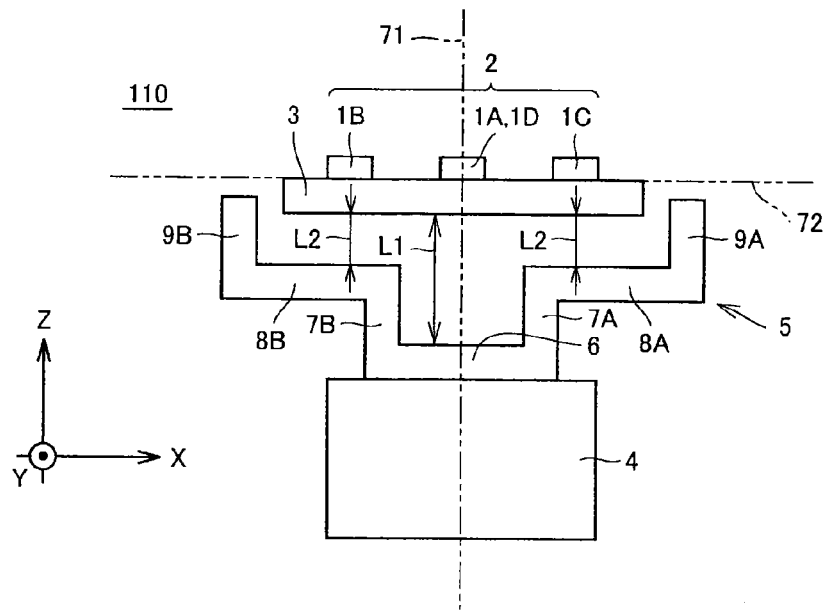
FIG. 11 is a side view of a magnetic position detecting device 110 according to the first modification of the first embodiment.

FIG. 11 is a side view of a magnetic position detecting device 110 according to the first modification of the first embodiment. Magnetic position detecting device 110 in FIG. 11 is different from magnetic position detecting device 10 in FIG. 2 in that plate-shaped portion 6 of flux guide 5 and magnet 4 are in close contact with each other. Since other features in FIG. 11 are the same as those in FIG. 2, the same or corresponding components are designated by the same reference characters, and description thereof will not be repeated. Even in the arrangement in which flux guide 5 and magnet 4 are in close contact with each other as shown in FIG. 11, the functions and effects similar to those in the case of the arrangement in FIG. 2 can also be achieved.

Second Modification of First Embodiment

Figure 12:
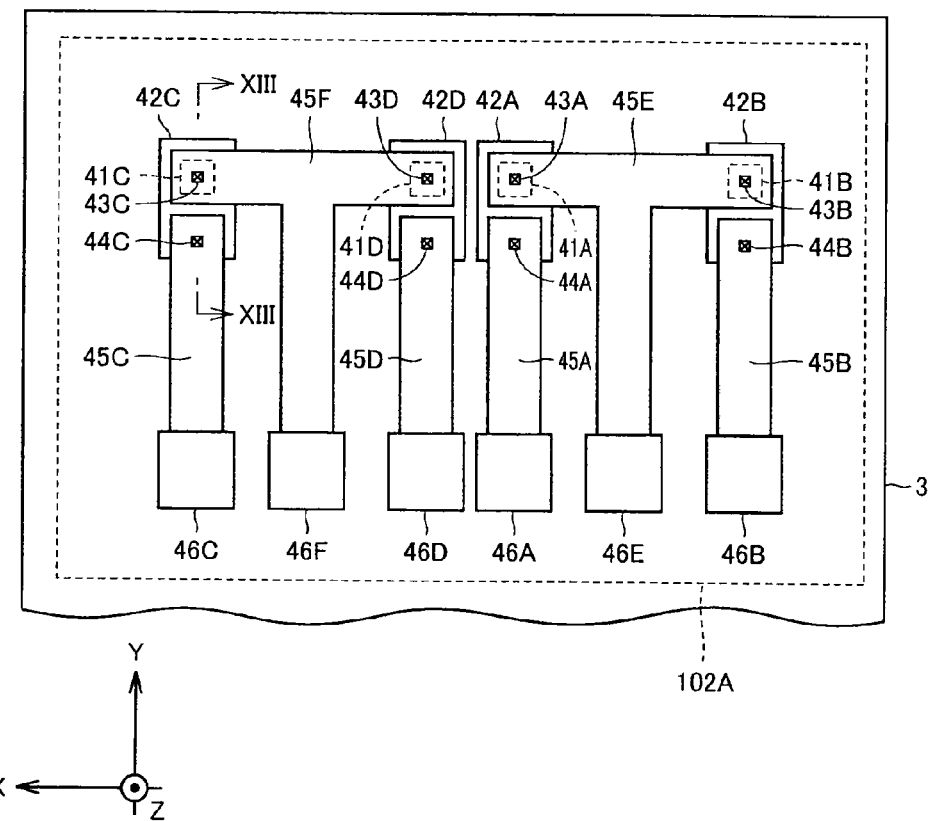
FIG. 12 is a plan view showing a specific arrangement of first to fourth magnetoelectric conversion elements 41A to 41D according to the second modification of the first embodiment.

FIG. 12 is a plan view showing a specific arrangement of first to fourth magnetoelectric conversion elements 41A to 41D according to the second modification of the first embodiment.

Figure 13:
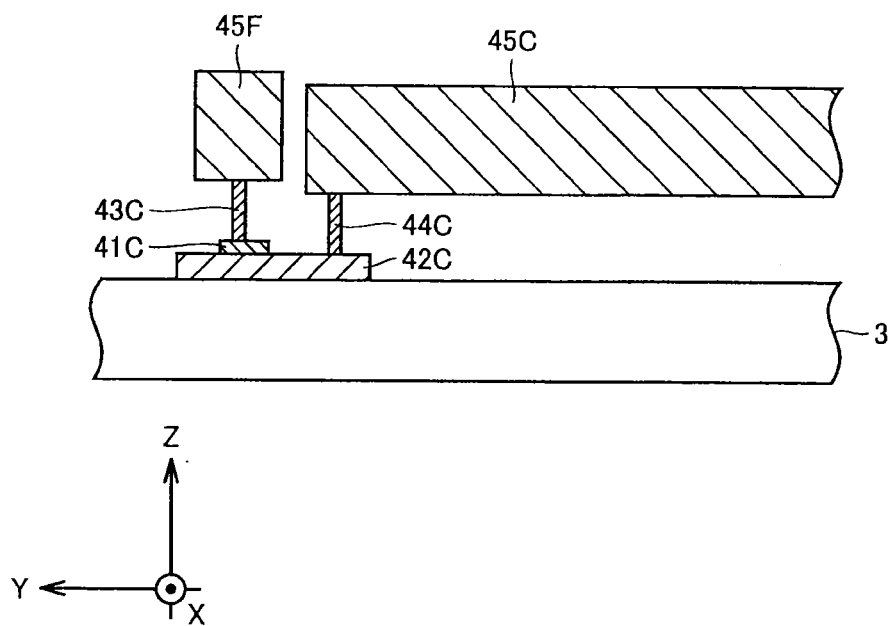
FIG. 13 is a cross sectional view taken along a section line XIII-XIII in FIG. 12.

FIG. 13 is a cross sectional view taken along a section line XIII-XIII in FIG. 12. FIGS. 12 and 13 each show the case where each of magnetoelectric conversion elements 1A to 1D is formed of a TMR element.

The TMR element is a stacked body having such a structure as including an antiferromagnetic film/a ferromagnetic film (1)/an insulating film/a ferromagnetic film (2). The direction of magnetization of ferromagnetic film (1) is fixed in the desired direction by the antiferromagnetic film in contact therewith, and referred to as a fixed layer. The direction of magnetization of the ferromagnetic film (2) rotates in accordance with the direction of the external magnetic field, and is referred to as a free layer. When a current flows between the upper and lower electrodes, the TMR element shows a resistance change in proportion to $\cos\theta$ similarly to the above-described equation (1) in which the angle formed between the magnetization direction of the fixed layer and the magnetization direction of the free layer is assumed as $\theta$.

In FIGS. 12 and 13, a TMR element 41A as magnetoelectric conversion element 1A is formed on a lower electrode 42A, and connected through a contact hole 43A to an upper electrode 45E. A TMR element 41B as magnetoelectric conversion element 1B is formed on a lower electrode 42B, and connected through a contact hole 43B to an upper electrode 45E. A TMR element 41C as magnetoelectric conversion element 1C is formed on a lower electrode 42C, and connected through a contact hole 43C to an upper electrode 45F. A TMR element 41D as magnetoelectric conversion element 1D is formed on a lower electrode 42D, and connected through a contact hole 43D to upper electrode 45F.

Lower electrode 42A is connected through a contact hole 44A to an upper interconnection 45A while lower electrode 42B is connected through a contact hole 44B to an upper interconnection 45B. Lower electrode 42C is connected through a contact hole 44C to an upper interconnection 45C while lower electrode 42D is connected through a contact hole 44D to an upper interconnection 45D. Upper interconnections 45A to 45D are connected to pads 46A to 46D, respectively, while upper electrodes 45E and 45F are connected to pads 46E and 46F, respectively.

Pads 46A and 46C in FIG. 12 are connected to power supply node VCC while pads 46B and 46D are connected to ground node GND, thereby forming a bridge circuit 102A. Pad 46E corresponds to connection node ND1 of bridge circuit 2 in FIG. 4 while pad 46F corresponds to connection node ND2 thereof.

Specifically, in order to achieve the structure in FIGS. 12 and 13, for example, a stacked body having such a structure as including Ta/NiFe/IrMn/CoFe/AlOx (aluminum oxide)/CoFe/Ta is formed. Then, this stacked body is processed by known photolithography and ion beam etching into the structure consisting of lower electrodes 42A to 42D and the structure consisting of TMR elements 41A to 41D which are shown in FIGS. 12 and 13. Then, after forming an interlayer insulating film, a contact hole is formed, on which upper electrodes 45E and 45F and upper interconnections 45A to 45D are formed.

It is preferable that the angle formed between the magnetization direction of the fixed layer and the direction of the magnetic field applied to each magnetoelectric conversion element (TMR element) is significantly different between the case where each magnetoelectric conversion element faces recess 22 of magnetic moving body 20 and the case where each magnetoelectric conversion element faces protrusion 21 of magnetic moving body 20. For example, it is only necessary to set the orientation of magnetization of the fixed layer to be in the X-axis direction, so as to apply a magnetic field to each magnetoelectric conversion element (TMR element) at a desired angle when each magnetoelectric conversion element faces recess 22 of magnetic moving body 20, and to apply a magnetic field to each magnetoelectric conversion element (TMR element) approximately in the Y-axis direction when each magnetoelectric conversion element faces protrusion 21 of magnetic moving body 20.

Third Modification of First Embodiment

Figure 14:
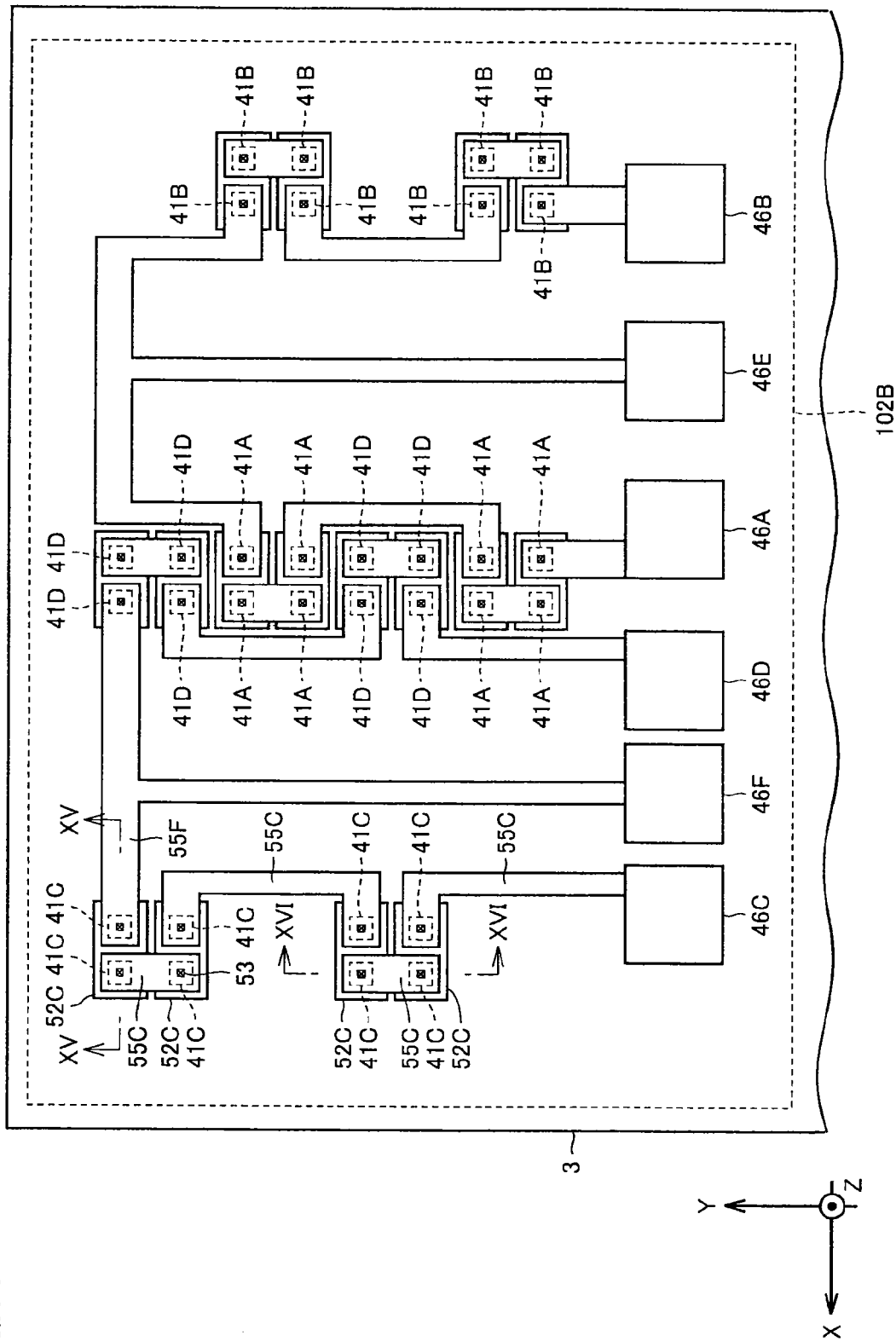
FIG. 14 is a plan view showing a specific arrangement of first to fourth magnetoelectric conversion elements 41A to 41D according to the third modification of the second embodiment.

FIG. 14 is a plan view showing a specific arrangement of first to fourth magnetoelectric conversion elements 41A to 41D according to the third modification of the second embodiment.

Figure 15:
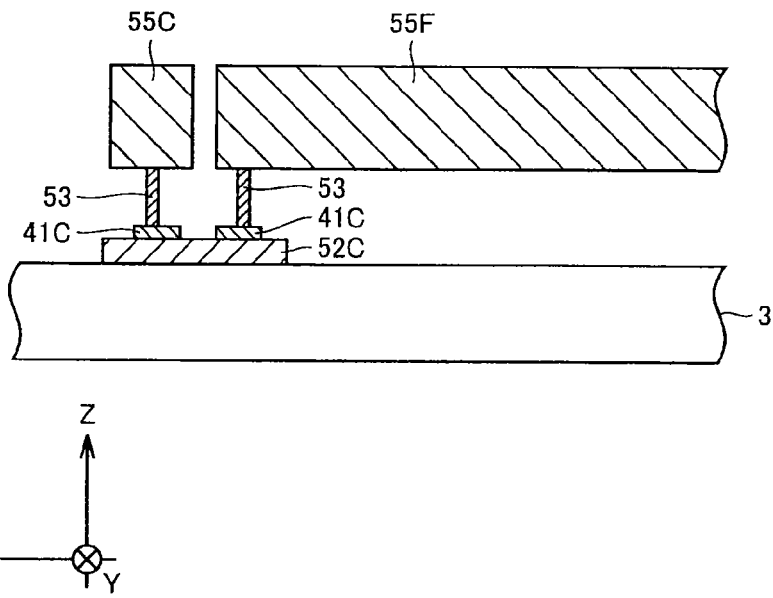
FIG. 15 is a cross sectional view taken along a section line XV-XV in FIG. 14.
Figure 16:
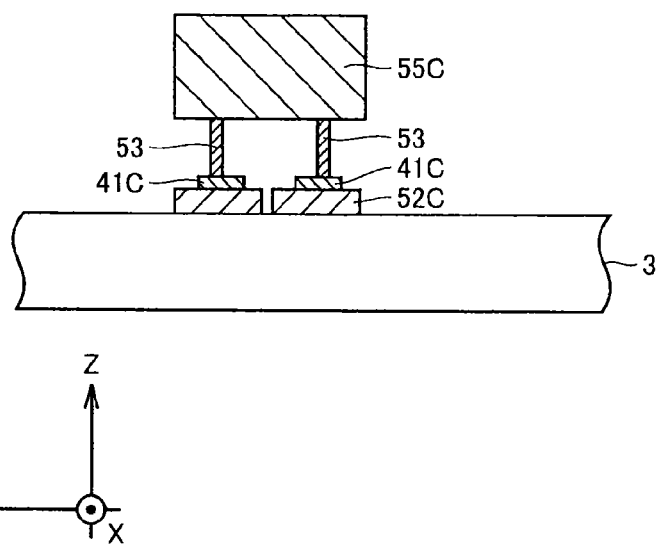
FIG. 16 is a cross sectional view taken along a section line XVI-XVI in FIG. 14.

FIG. 15 is a cross sectional view taken along a section line XV-XV in FIG. 14. FIG. 16 is a cross sectional view taken along a section line XVI-XVI in FIG. 14. FIGS. 14 to 16 each show an example where eight TMR elements in cascade connection constitute each of magnetoelectric conversion elements 1A to 1D. For example, each TMR element 41C is formed on a lower electrode 52C formed on substrate 3. TMR element 41C is further connected through a contact hole 53 to an upper interconnection 55C or 55F.

Other Modifications

Signal conversion circuit 33 in FIG. 4 may exhibit a rotation direction in combination with a flip-flop circuit, as disclosed in the above-mentioned Japanese Patent Laying-Open No. 2004-109113 (PTL 1). Furthermore, it may output a rotation direction, a rotation speed and the like as a signal in combination with other signals.

In the above description, the center positions of magnetoelectric conversion elements 1A to 1D are arranged in line in the X-axis direction. In contrast, magnetoelectric conversion elements 1A and 1D are displaced in the Y-axis direction with respect to magnetoelectric conversion elements 1B and 1C, thereby allowing a further increase in the amount of change in the output voltage of bridge circuit 2 that is caused by the change from the state where each magnetoelectric conversion element faces recess 22 of magnetic moving body 20 to the state where each magnetoelectric conversion element faces protrusion 21 of magnetic moving body 20.

Although magnetic moving body 20 is formed in the shape of a disc that rotates about a central axis 23 in the above description, it may be configured to linearly move. Magnetic position detecting device 10 is disposed at a prescribed distance from the path through which magnetic moving body 20 moves. In this case, the movement direction of magnetic moving body 20 is parallel to the X-axis direction in FIG. 1.

Although flux guide 5 in FIGS. 1 and 2 is formed of a plate-shaped member, it may have a curved shape having a rounded surface instead. Flux guide 5 may be of any shape as long as it causes a difference in the distance between flux guide 5 and each magnetoelectric conversion element, so as to cause a difference between the component of the magnetic field parallel to the substrate in the position of each of magnetoelectric conversion elements 1A, 1D and the component of the magnetic field in the position of each of magnetoelectric conversion elements 1B, 1C at the time when each magnetoelectric conversion element faces protrusion 21 of magnetic moving body 20.

Second Embodiment

Figure 17:
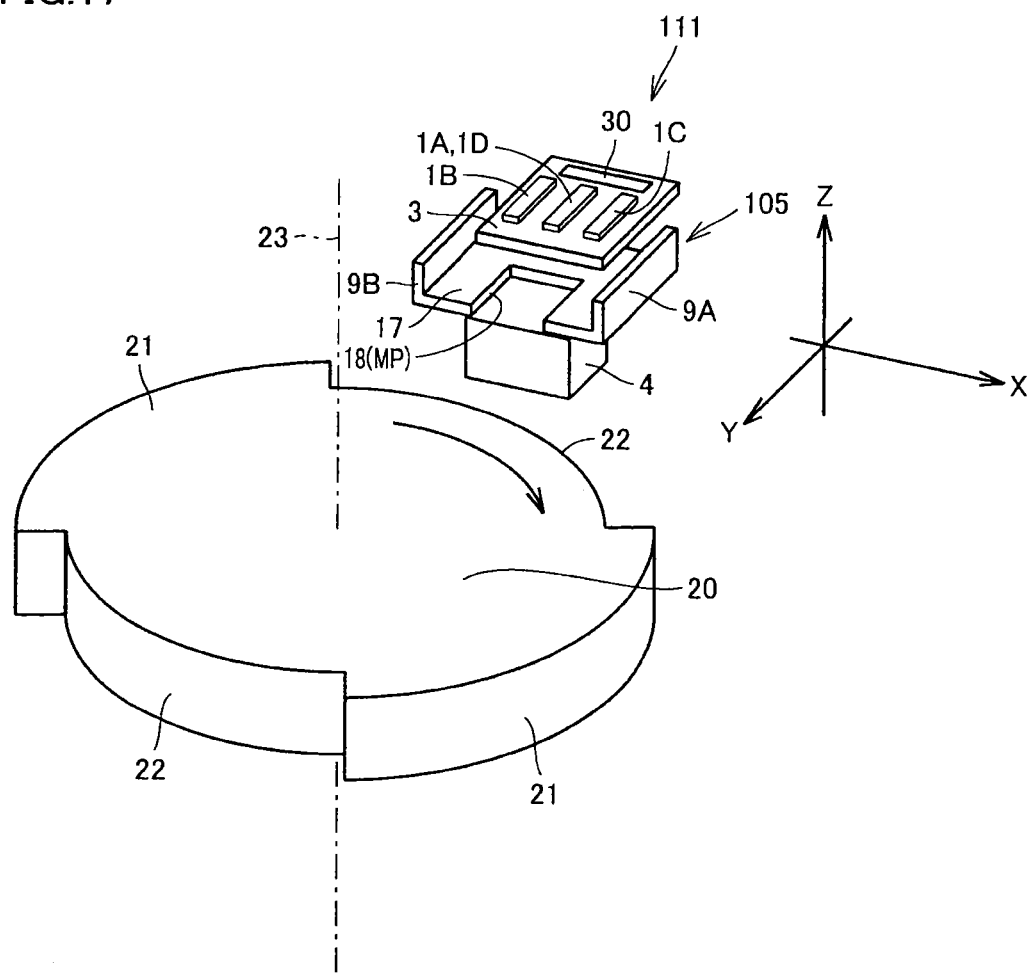
FIG. 17 is a perspective view of a magnetic position detecting device 111 according to the second embodiment of the present invention.

FIG. 17 is a perspective view of a magnetic position detecting device 111 according to the second embodiment of the present invention.

Figure 18:
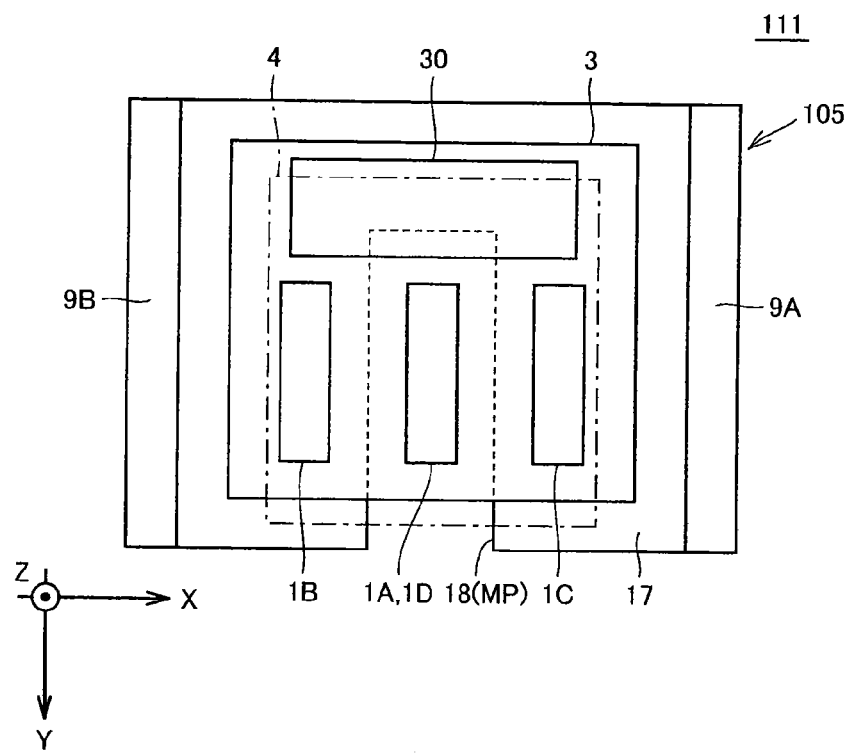
FIG. 18 is a plan view of magnetic position detecting device 111 in FIG. 17.

FIG. 18 is a plan view of magnetic position detecting device 111 in FIG. 17. Magnetic position detecting device 111 shown in each of FIGS. 17 and 18 is different from magnetic position detecting device 10 shown in each of FIGS. 1 and 2 in that a flux guide 105 is provided with a notch portion 18 in place of a recessed concave portion (6, 7A, 7B) provided in flux guide 5. Notch portion 18 corresponds to center portion MP shown in each of FIGS. 1 and 2. Notch portion 18 is formed so as to open in the +Y direction in the mid-portion between protrusions 9A and 9B (the direction toward magnetic moving body 20).

FIGS. 17 and 18 each show a specific example of the structure of flux guide 105 described above. In FIGS. 17 and 18, flux guide 105 consists of plate-shaped portions 17, 9A, and 9B. Plate-shaped portion 17 is parallel to substrate 3, and has notch portion 18 that is formed in the mid-portion in the X-axis direction and opens in the +Y direction. Plate-shaped portions 9A and 9B are connected to both ends, respectively, in the X-axis direction of plate-shaped portion 17. Plate-shaped portions 9A and 9B each extend in the direction at a right angle to plate-shaped portion 6 and toward the virtual plane extending from one surface of substrate 3. Plate-shaped portions 9A and 9B correspond to protrusions 9A and 9B, respectively. The shape of flux guide 105 is symmetrical with respect to the symmetrical line exactly at the midpoint between plate-shaped portions 9A and 9B, as seen in the Z-axis direction.

Magnetoelectric conversion elements 1A and 1D are disposed in the vicinity of the above-described symmetrical line so as to overlap with notch portion 18, as seen in the Z-axis direction. Accordingly, magnet 4 can be directly seen from the positions of magnetoelectric conversion elements 1A to 1D without being interrupted by the magnetic material portion of flux guide 5. Magnetoelectric conversion element 1B is provided between notch portion 18 and plate-shaped portion 9B as seen in the Z-axis direction while magnetoelectric conversion element 1C is provided between notch portion 18 and plate-shaped portion 9C as seen in the Z-axis direction. Preferably, the distance between the above-described symmetrical line and magnetoelectric conversion element 1B is equal to the distance between the above-described symmetrical line and magnetoelectric conversion element 1C. Preferably, the centers of magnetoelectric conversion elements 1A to 1D are disposed so as to be aligned in the X-axis direction.

According to the configuration of the above-described magnetic position detecting device 111, the distance from each of magnetoelectric conversion elements 1A and 1D to magnet 4 is longer than the distance from each of magnetoelectric conversion elements 1B and 1C to flux guide 5.

Accordingly, based on the same principle as in the case of magnetic position detecting device 10 in the first embodiment, while maintaining an optimal range of the magnetic field region where magnetoelectric conversion elements 1A to 1D operate, it becomes possible to increase the change in the output voltage of bridge circuit 2 caused by the change from the state where each magnetoelectric conversion element faces protrusion 21 of magnetic moving body 20 to the state where each magnetoelectric conversion element faces recess 22 of magnetic moving body 20. Consequently, even when the distance between magnetic position detecting device 10 and magnetic moving body 20 is so great that the conventional magnetic position detecting device cannot detect, it is possible to distinguish whether each magnetoelectric conversion element faces protrusion 21 or recess 22.

Since other features in FIGS. 17 and 18 are the same as those of magnetic position detecting device 10 in the first embodiment, the same or corresponding components are designated by the same reference characters, and description thereof will not be repeated.

Figure 19:
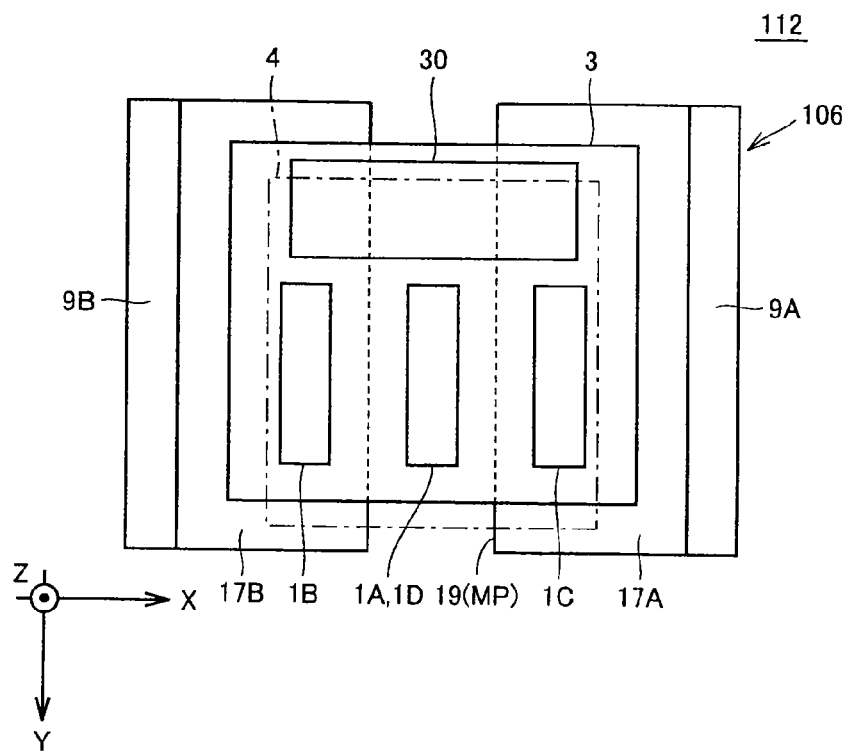
FIG. 19 is a plan view of a magnetic position detecting device 112 according to a modification of the second embodiment.

FIG. 19 is a plan view of a magnetic position detecting device 112 according to the modification of the second embodiment. FIG. 19 shows the case where notch portion 18 in FIG. 18 is extended in the Y-axis direction to form an opening portion 19 having a length identical to the length of the flux guide in the Y-axis direction. Plate-shaped portion 17 is divided by opening portion 19 into a plate-shaped portion 17A connected to plate-shaped portion 9A and a plate-shaped portion 17B connected to plate-shaped portion 9B. Opening portion 19 corresponds to center portion MP in each of FIGS. 1 and 2. It is preferable that a magnetically divided flux guide 106 is fixed by adhesion using non-magnetic material, for example, non-magnetic metal such as resin, ceramics, aluminum, or copper.

Even in the case of the configuration of magnetic position detecting device 112 shown in FIG. 19, it is possible to increase the change in the output voltage of bridge circuit 2 caused by the change from the state where each magnetoelectric conversion element faces protrusion 21 of magnetic moving body 20 to the state where each magnetoelectric conversion element faces recess 22 of magnetic moving body 20, in the completely same manner as that in the case of magnetic position detecting device 111 in FIGS. 17 and 18.

Third Embodiment

Figure 20:
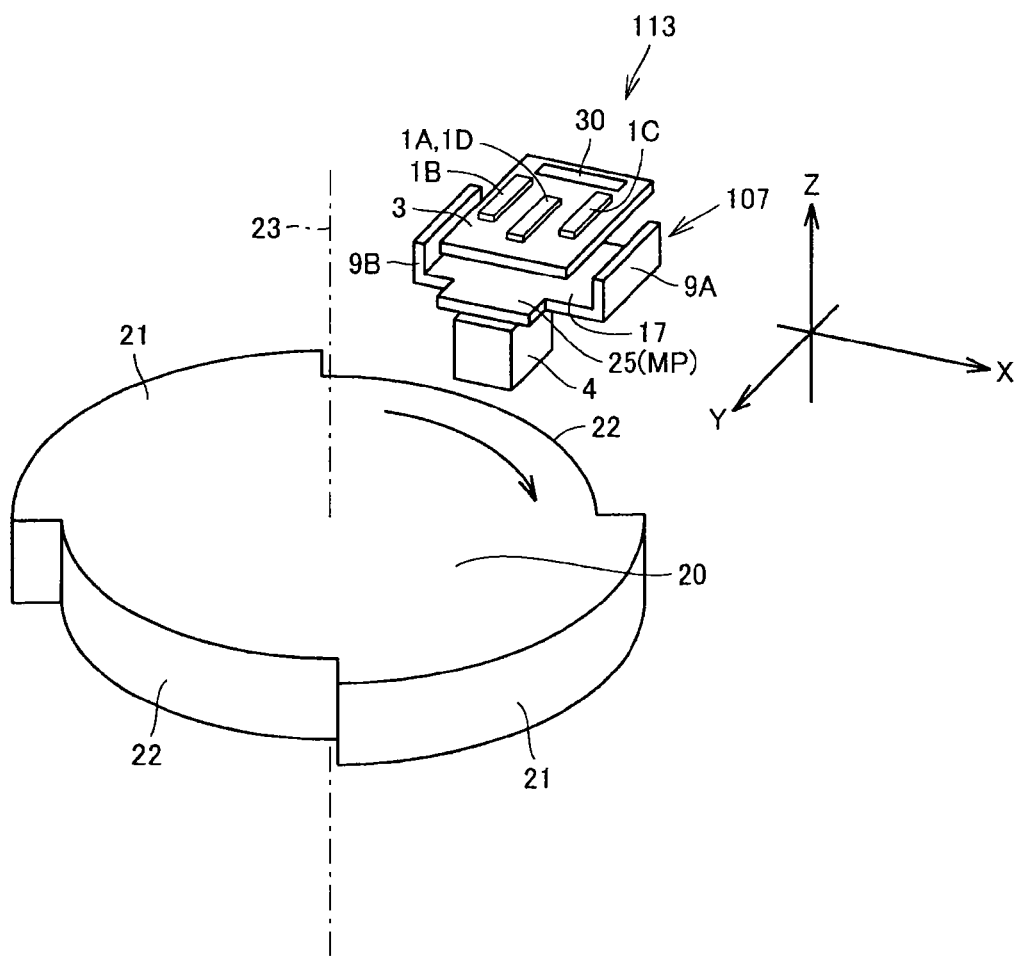
FIG. 20 is a perspective view of a magnetic position detecting device 113 according to the third embodiment of the present invention.

FIG. 20 is a perspective view of a magnetic position detecting device 113 according to the third embodiment of the present invention.

Figure 21:
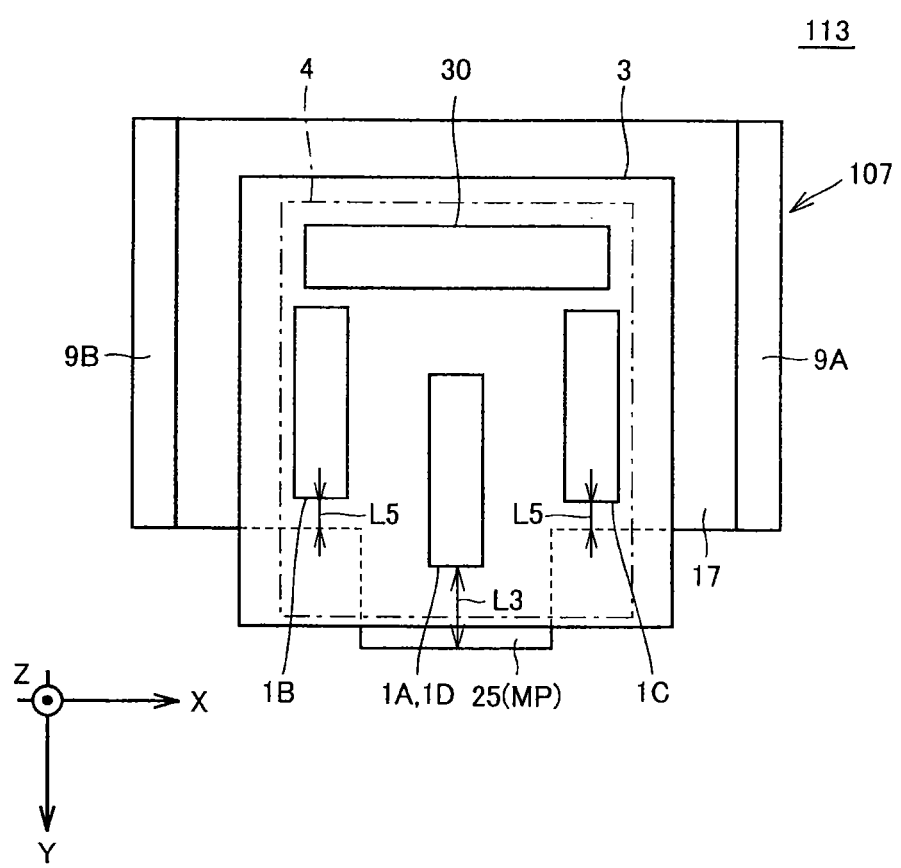
FIG. 21 is a plan view of magnetic position detecting device 113 in FIG. 20.

FIG. 21 is a plan view of magnetic position detecting device 113 in FIG. 20. A flux guide 107 shown in each of FIGS. 20 and 21 consists of plate-shaped portions 17, 9A and 9B. Plate-shaped portion 17 is parallel to substrate 3 and has an end face in the +Y direction protruding in the +Y direction (the direction toward magnetic moving body 20) in the mid-portion between protrusions 9A and 9B. Plate-shaped portions 9A and 9B are connected to both ends, respectively, in the X-axis direction of plate-shaped portion 17. Each of plate-shaped portions 9A and 9B extends in the direction at a right angle to plate-shaped portion 17 and toward the virtual plane extending from one surface of substrate 3. Plate-shaped portions 9A and 9B correspond to protrusions 9A and 9B, respectively. Center portion 25 corresponding to a portion of plate-shaped portion 17 that has a length increased in the Y-axis direction by the end face protruding in the +Y direction corresponds to center portion MP in FIGS. 1 and 2, notch portion 18 in FIGS. 17 and 18, or opening portion 19 in FIG. 19. It is preferable that the shape of flux guide 107 is symmetrical with respect to the symmetrical line exactly at the midpoint between plate-shaped portions 9A and 9B, as seen in the Z-axis direction.

Magnetoelectric conversion elements 1A and 1D are disposed in the vicinity of the above-described symmetrical line so as to overlap with center portion 25 as seen in the Z-axis direction. Magnetoelectric conversion element 1B is provided between center portion 25 and plate-shaped portion 9B as seen in the Z-axis direction while magnetoelectric conversion element 1C is provided between center portion 25 and plate-shaped portion 9C as seen in the Z-axis direction. The distance between the above-described symmetrical line and magnetoelectric conversion element 1B is equal to the distance between the above-described symmetrical line and magnetoelectric conversion element 1C.

As sees in the Z-axis direction, each of magnetoelectric conversion elements 1A and 1D is disposed so as to protrude in the +Y direction with respect to any of magnetoelectric conversion elements 1B and 1C (that is, disposed closer to magnetic moving body 20). Furthermore, as seen in the Z-axis direction, a distance L3 extending in the Y-axis direction from the end face in the +Y direction to each of magnetoelectric conversion elements 1A and 1D is longer than a distance L5 extending in the Y-axis direction from the end face in the +Y direction to each of magnetoelectric conversion elements 1B and 1C.

Figure 22:
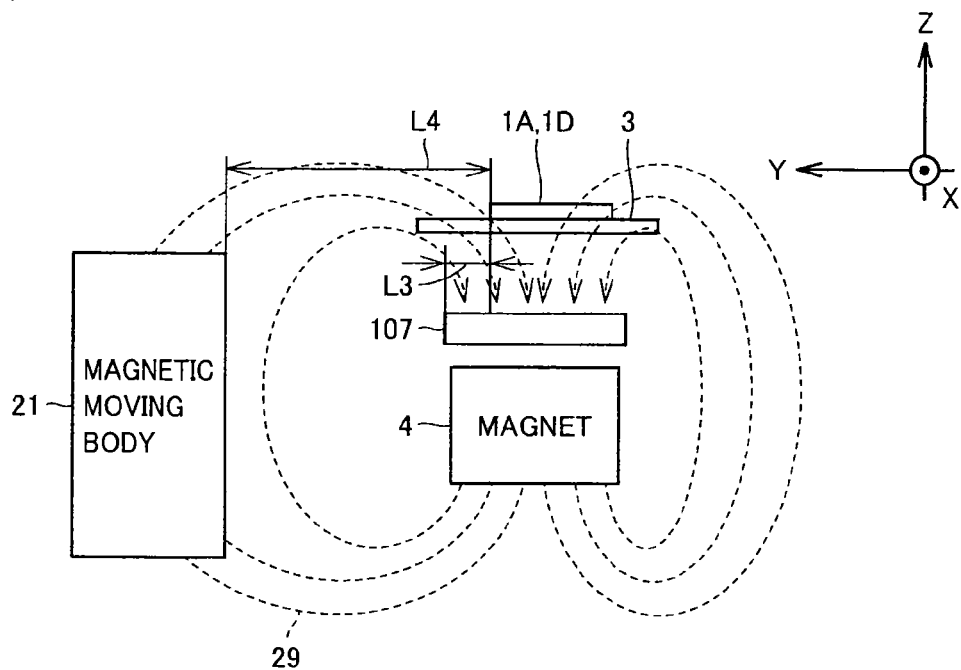
FIG. 22 is a diagram for illustrating the effects of a flux guide 107 shown in FIGS. 20 and 21.
Figure 22:
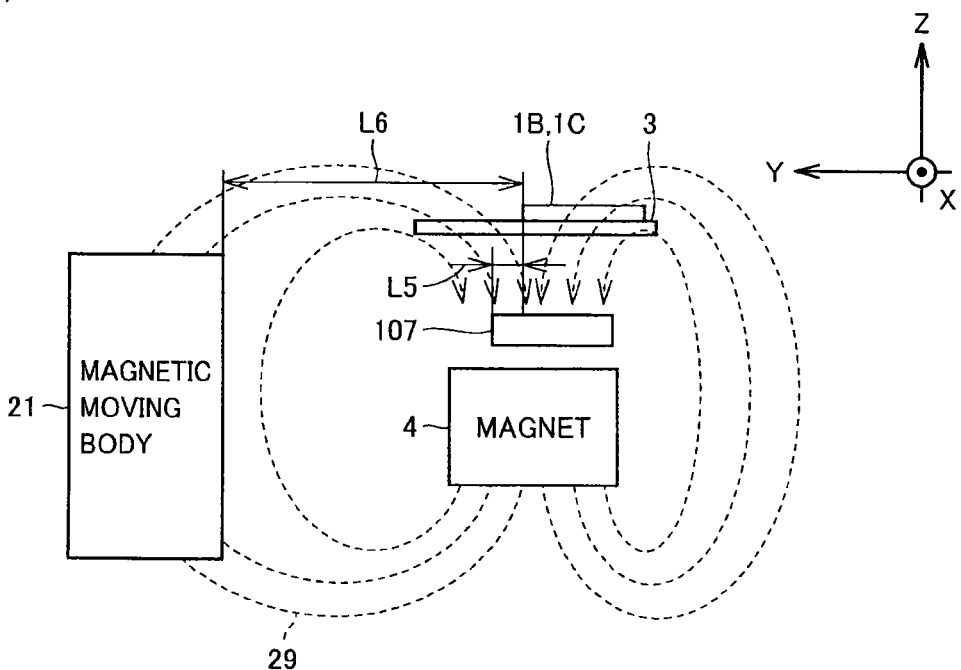

FIG. 22 is a diagram for illustrating the effects of flux guide 107 shown in FIGS. 20 and 21.

FIG. 22(A) is a diagram schematically showing the arrangement of magnetoelectric conversion elements 1A and 1D. As seen in the Z-axis direction, each of magnetoelectric conversion elements 1A and 1D is disposed at a distance L4 from magnetic moving body 20 (protrusion 21) and also disposed at distance L3 from the end face of flux guide 107 located on the +Y direction side. FIG. 22(B) is a diagram schematically showing the arrangement of magnetoelectric conversion elements 1B and 1C. As seen in the Z-axis direction, each of magnetoelectric conversion elements 1B and 1C is disposed at a distance L6 (L6>L4) from magnetic moving body 20 (protrusion 21) and also disposed at distance L5 (L5<L3) from the end face of flux guide 107 located on the +Y direction side.

As illustrated in FIG. 7, there are characteristics described below in the relationship between the positions of magnetoelectric conversion elements 1A to 1D formed in substrate 3 and the magnitude of the applied magnetic field.

(1) The magnitude (|B|) of the magnetic field is decreased as substrate 3 is away from magnet 4 and flux guide 107.

(2) The change rate of the component of the magnetic field parallel to substrate 3 (component Bxy in the in-plane direction of the substrate) between the case where each magnetoelectric conversion element faces protrusion 21 of magnetic moving body 20 and the case where each magnetoelectric conversion element does not face protrusion 21 of magnetic moving body 20 is determined by the relative relationship between distance D1 from the magnetoelectric conversion element to magnetic moving body 20 and distance D2 from the magnetoelectric conversion element to magnet 4 (flux guide 107). The change rate of component Bxy of the magnetic field caused by movement of magnetic moving body 20 is increased as distance D1 becomes shorter than distance D2.

(3) The more substrate 3 is away in the Z-axis direction from magnet 4 and flux guide 107, the more the proportion of component Bxy of the magnetic field parallel to substrate 3 with respect to the component of the magnetic field perpendicular to substrate 3 is increased (in other words, the angle formed between the direction of the magnetic field and the in-plane direction of the substrate is decreased).

(4) Although the magnetic field distribution in the vicinity of flux guide 107 shows a magnetic field that is almost perpendicular to the plane of flux guide 107 in the flat portion, the direction of the magnetic field abruptly changes in the peripheral edge portion. Consequently, with regard to the direction of the magnetic field in substrate 3, the closer the peripheral edge portion of flux guide 107 as seen in the Z-axis direction, the more the angle formed between the direction of the magnetic field and the substrate plane is decreased.

According to above-described (2), since distance L4 between magnetic moving body 20 (protrusion 21) and each of magnetoelectric conversion elements 1A and 1D is shorter than distance L6 between magnetic moving body 20 (protrusion 21) and each of magnetoelectric conversion elements 1B and 1C, the change rate of component Bxy of the magnetic field to be applied is greater in magnetoelectric conversion elements 1A and 1D.

Furthermore, according to the above-described (4), since magnetoelectric conversion elements 1B and 1C are disposed closer to the peripheral edge portion of flux guide 107 than magnetoelectric conversion elements 1A and 1D as seen in the Z-axis direction, the angle formed between the direction of the applied magnetic field and the substrate plane is decreased. In other words, since magnetoelectric conversion elements 1B and 1C provide a relatively large component Bxy of the magnetic field when each magnetoelectric conversion element faces recess 22 of magnetic moving body 20, the change rate of component Bxy of the magnetic field between the case of facing protrusion 21 and the case of facing recess 22 is decreased.

By the combination of the above-described effects, the amount of change in component Bxy of the magnetic field parallel to substrate 3 caused by movement of magnetic moving body 20 is greater in magnetoelectric conversion elements 1A and 1D than in magnetoelectric conversion elements 1B and 1C. Consequently, it becomes possible to increase the change in the output voltage of bridge circuit 2 that is caused by the change from the state where each magnetoelectric conversion element faces protrusion 21 of magnetic moving body 20 to the state where each magnetoelectric conversion element faces recess 22 of magnetic moving body 20.

Fourth Embodiment

Figure 23:
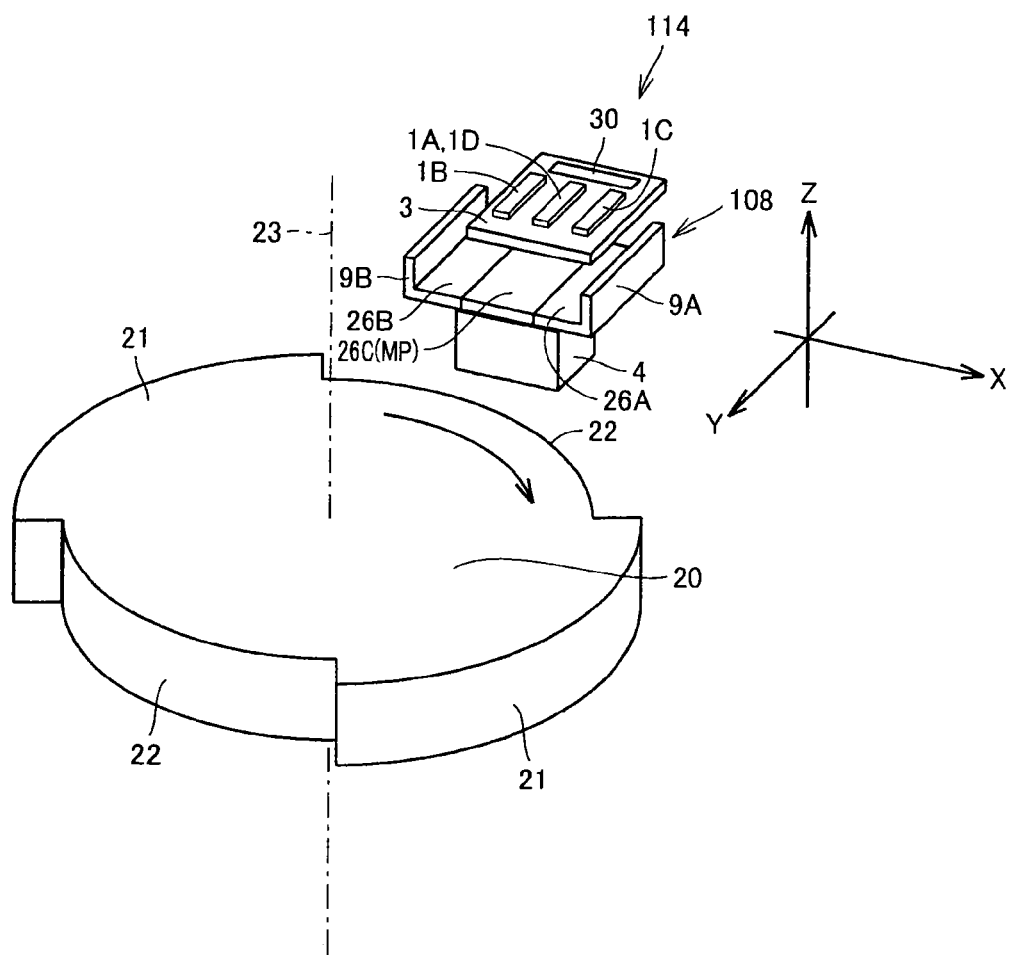
FIG. 23 is a perspective view of a magnetic position detecting device 114 according to the fourth embodiment of the present invention.

FIG. 23 is a perspective view of a magnetic position detecting device 114 according to the fourth embodiment of the present invention.

Figure 24:
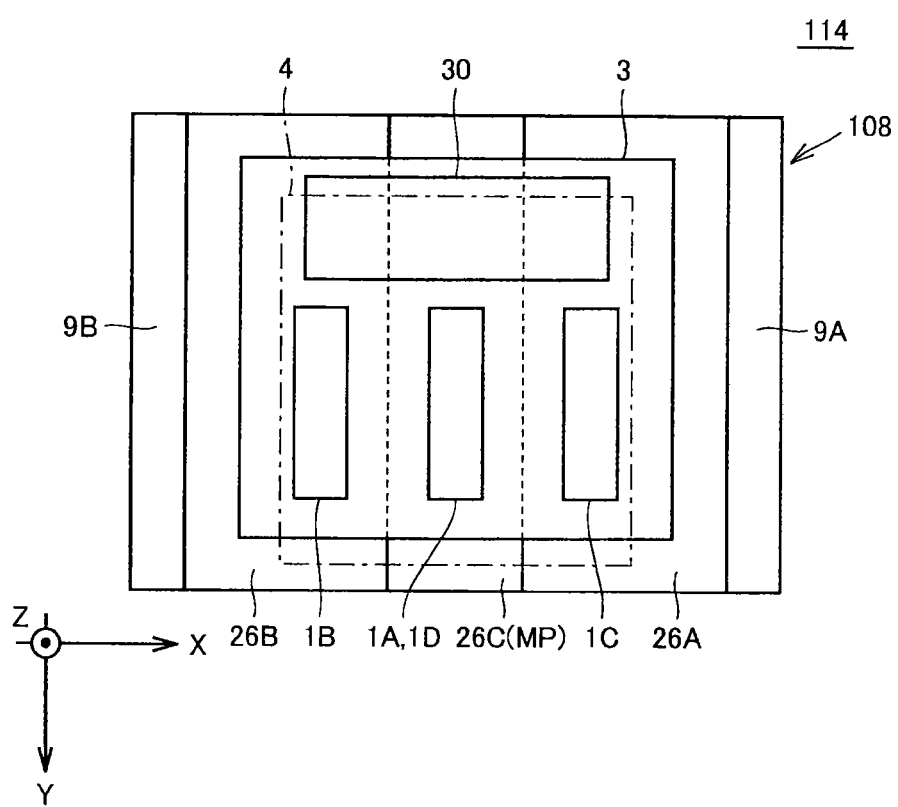
FIG. 24 is a plan view of magnetic position detecting device 114 in FIG. 23.

FIG. 24 is a plan view of magnetic position detecting device 114 in FIG. 23. Flux guide 108 shown in each of FIGS. 23 and 24 consists of plate-shaped portions 26A, 26B, 26C, 9A, and 9B.

Plate-shaped portions 26A, 26C and 26B are arranged in this order in the X-axis direction in the plane parallel to substrate 3. The magnetic permeability of plate-shaped portion 26C sandwiched between plate-shaped portions 26A and 26B is lower than the magnetic permeability of plate-shaped portions 26A and 26B. In order to change the magnetic permeability, for example, materials having different magnetic properties (for example, an alloy made of different compositions such as Fe, Ni and Co, and the like) may be magnetically coupled, or the magnetic permeability may be changed by partially applying stress. Alternatively, the magnetic property may be changed by changing the magnetic domain structure on the surface by laser, or, for example, Si (silicon) and the like may be partially diffused.

Plate-shaped portion 9A is connected to the end of plate-shaped portion 26A on the side opposite to plate-shaped portion 26C and extends in the direction at a right angle to plate-shaped portion 26A toward the virtual plane extending from one surface of substrate 3. Plate-shaped portion 9A corresponds to protrusion 9A. Plate-shaped portion 9B is connected to the end of plate-shaped portion 26B on the side opposite to plate-shaped portion 26C and extends in the direction at a right angle to plate-shaped portion 26B toward the virtual plane extending from one surface of substrate 3. Plate-shaped portion 9B corresponds to protrusion 9B. Flux guide 108 is symmetrical with respect to the symmetrical line exactly at the midpoint between plate-shaped portions 9A and 9B as seen in the Z-axis direction.

Magnetoelectric conversion elements 1A and 1D are disposed in the vicinity of the above-described symmetrical line so as to overlap with plate-shaped portion 26C as seen in the Z-axis direction. Magnetoelectric conversion element 1B is provided between plate-shaped portion 26C and plate-shaped portion 9B as seen in the Z-axis direction while magnetoelectric conversion element 1C is provided between plate-shaped portion 26C and plate-shaped portion 9C as seen in the Z-axis direction. The distance between the above-described symmetrical line and magnetoelectric conversion element 1B is equal to the distance between the above-described symmetrical line and magnetoelectric conversion element 1C.

Plate-shaped portion 26C corresponds to center portion MP in FIGS. 1 and 2, notch portion 18 in FIGS. 17 and 18, opening portion 19 in FIG. 19, or center portion 25 in FIGS. 20 and 21. By providing plate-shaped portion 26C, the amount of change in component Bxy of the magnetic field parallel to substrate 3 caused by movement of magnetic moving body 20 becomes greater in magnetoelectric conversion elements 1A and 1D than in magnetoelectric conversion elements 1B and 1D. Consequently, it becomes possible to increase the change in the output voltage of bridge circuit 2 that is caused by the change from the state where each magnetoelectric conversion element faces protrusion 21 of magnetic moving body 20 to the state where each magnetoelectric conversion element faces recess 22 of magnetic moving body 20.

Fifth Embodiment

Although the first to fourth embodiments each show the configuration of a bridge circuit using four magnetoelectric conversion elements 1A to 1D, the position of magnetic moving body 20 can be detected based on the same principle using only magnetoelectric conversion elements 1A and 1B or only magnetoelectric conversion elements 1C and 1D.

Figure 25:
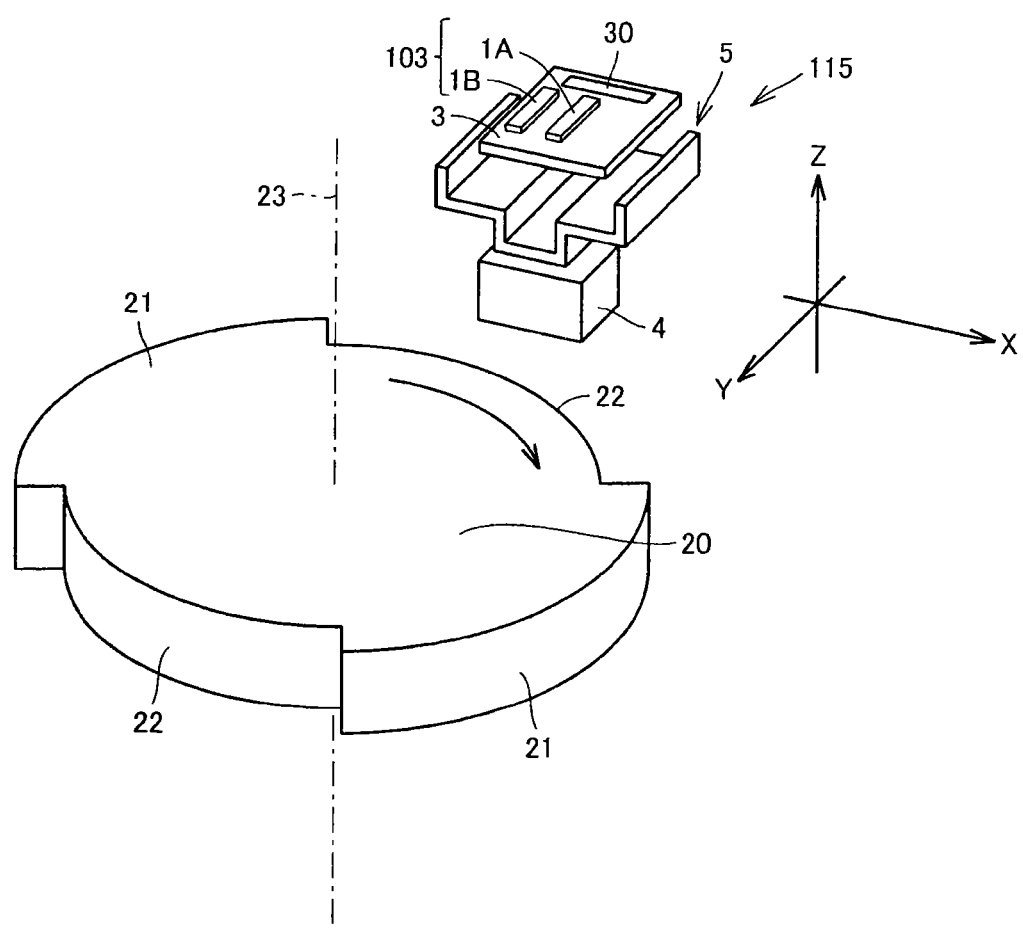
FIG. 25 is a perspective view of a magnetic position detecting device 115 according to the fifth embodiment of the present invention.

FIG. 25 is a perspective view of a magnetic position detecting device 115 according to the fifth embodiment of the present invention.

Figure 26:
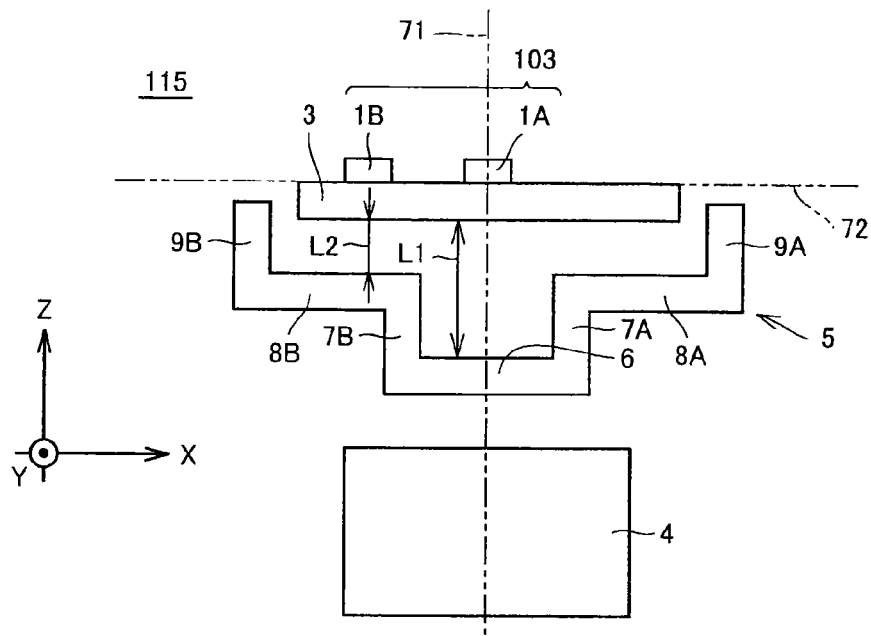
FIG. 26 is a side view of magnetic position detecting device 115 in FIG. 25.

FIG. 26 is a side view of magnetic position detecting device 115 in FIG. 25. A bridge circuit 103 forming magnetic position detecting device 115 shown in FIGS. 25 and 26 is different from bridge circuit 2 in FIGS. 1 and 2 in that only magnetoelectric conversion elements 1A and 1B are included but magnetoelectric conversion elements 1C and 1D are not included. Since other features in FIGS. 25 and 26 are the same as those in FIGS. 1 and 2, the same or corresponding components are designated by the same reference characters, and description thereof will not be repeated.

Figure 27:
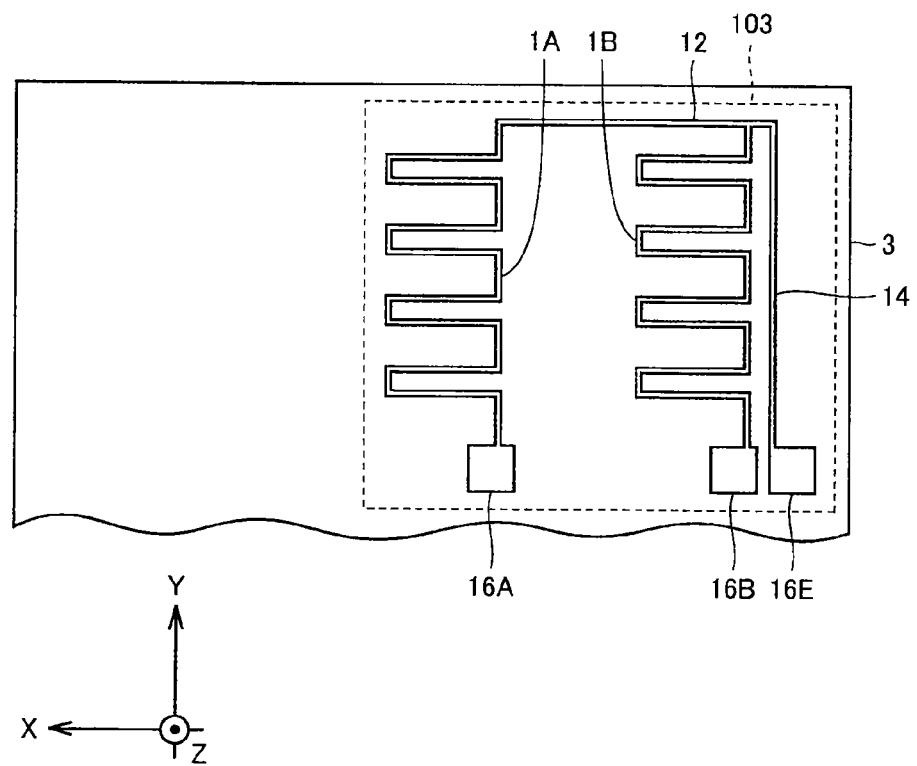
FIG. 27 is a plan view showing a specific arrangement of magnetoelectric conversion elements 1A and 1B in FIG. 25.
Figure 28:
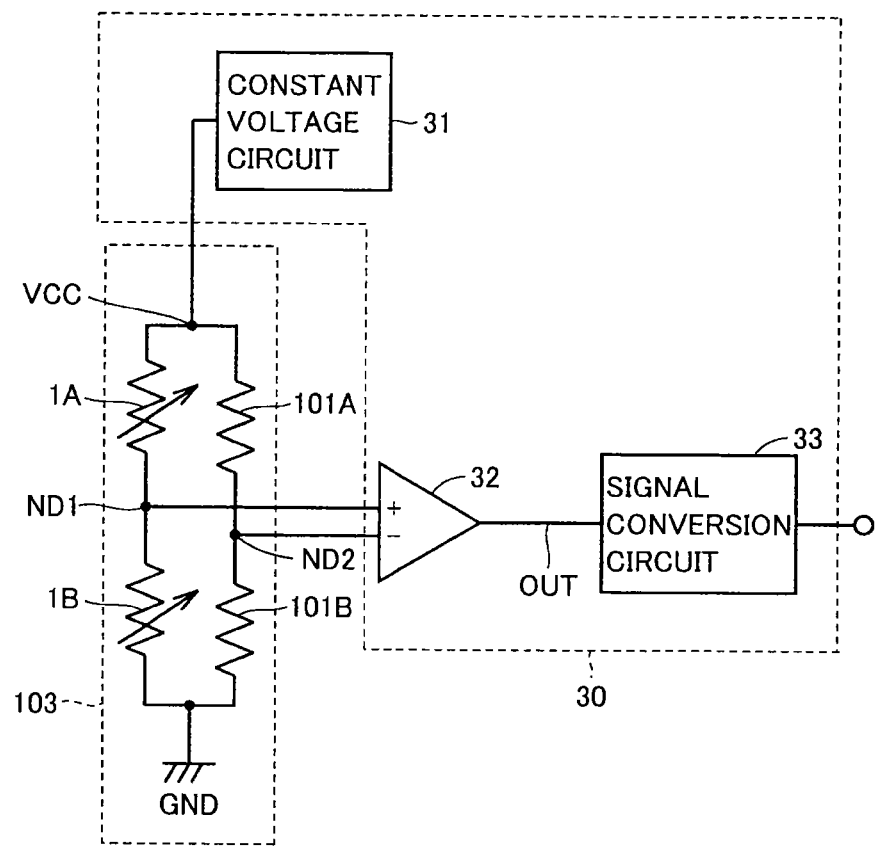
FIG. 28 is a circuit diagram of bridge circuit 103 and detection circuit 30 in FIG. 25.

FIG. 27 is a plan view showing a specific arrangement of magnetoelectric conversion elements 1A and 1B in FIG. 25. Magnetoelectric conversion elements 1A and 1B can be formed using a GMR element and the like as in the case in FIG. 3. FIG. 28 is a circuit diagram of bridge circuit 103 and detection circuit 30 in FIG. 25.

Referring to FIG. 28, bridge circuit 103 includes magnetoelectric conversion elements 1A, 1B and resistance elements 101A and 101B. Magnetoelectric conversion elements 1A and 1B are connected in this order in series to each other between power supply node VCC (the first power supply node) and ground node GND (the second power supply node). Resistance elements 101A and 101B are connected in this order in series to each other between power supply node VCC and ground node GND and also connected in parallel to a series-connected body of magnetoelectric conversion elements 1A and 1B. Differential amplifier circuit 32 amplifies the difference voltage between the voltage on connection node ND1 of magnetoelectric conversion elements 1A and 1B and the voltage on connection node ND2 of resistance elements 101A and 101B. Since other features are the same as those in FIG. 4, the same or corresponding components are designated by the same reference characters, and description thereof will not be repeated.

Figure 29:
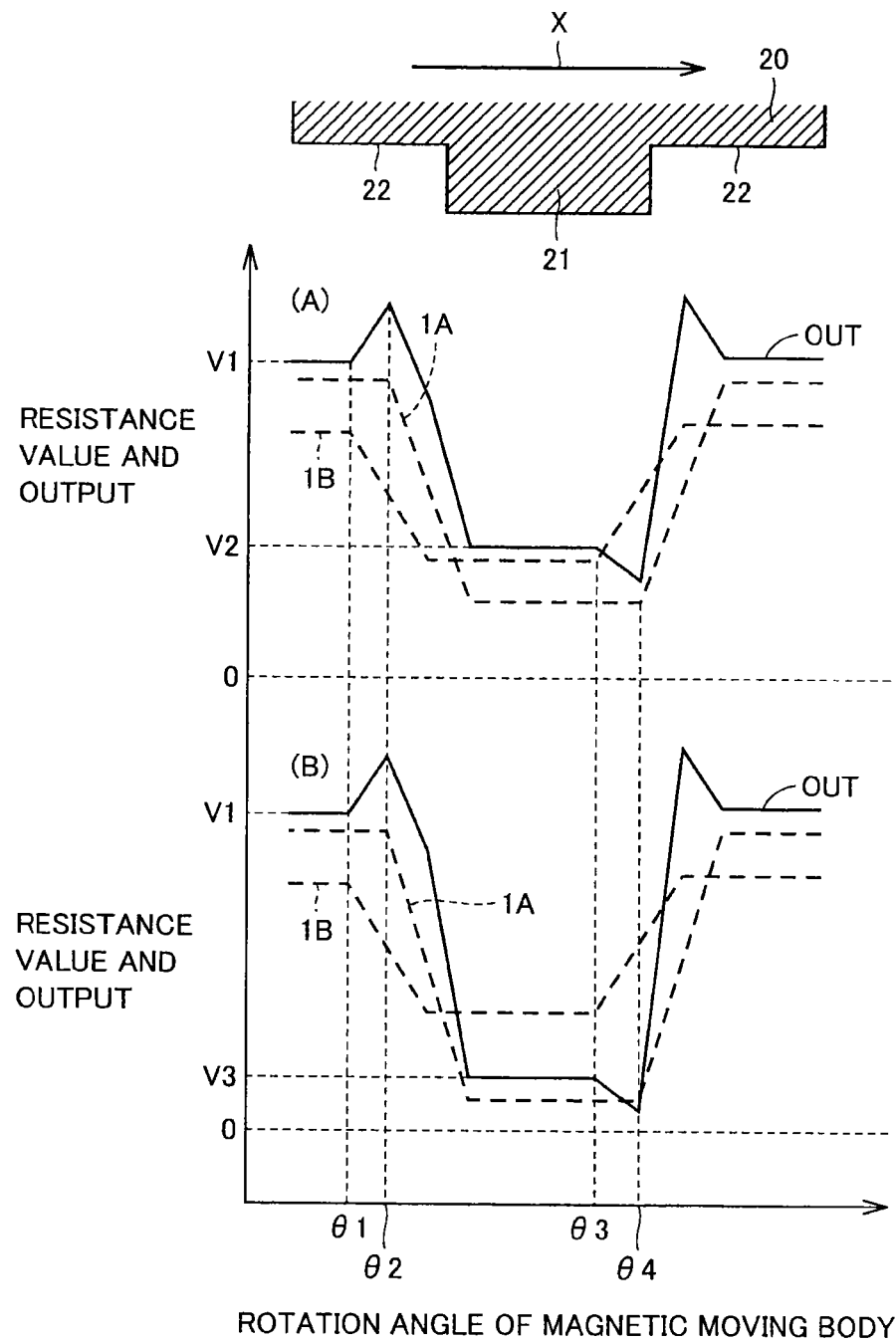
FIG. 29 is a diagram showing a change in the resistance value of each of magnetoelectric conversion elements 1A and 1B and the change in the output voltage of differential amplifier circuit 32 which are caused by rotation of magnetic moving body 20.

FIG. 29 is a diagram showing a change in the resistance value of each of magnetoelectric conversion elements 1A and 1B and the change in the output voltage of differential amplifier circuit 32 which are caused by rotation of magnetic moving body 20. FIG. 29(A) is a comparative example showing the case where flux guide 5 is not provided with a recessed concave portion (the case where the region between protrusions 9A and 9B is flat). FIG. 29(B) shows the case of flux guide 5 in the fifth embodiment. The graphs represented by characters 1A and 1B show resistance values of magnetoelectric conversion elements 1A and 1D, respectively, while the graph represented by character OUT shows the output voltage of differential amplifier circuit 32 in FIG. 28.

When the rotation angle of magnetic moving body 20 is θ1, magnetoelectric conversion elements 1B is changed from the state of facing recess 22 of magnetic moving body 20 to the state of facing protrusion 21 of magnetic moving body 20. This causes an abrupt decrease in the resistance value of magnetoelectric conversion element 1B.

Then, at rotation angle θ2, magnetoelectric conversion elements 1A is changed from the state of facing recess 22 of magnetic moving body 20 to the state of facing protrusion 21 of magnetic moving body 20. This causes an abrupt decrease in the resistance value of magnetoelectric conversion element 1A.

Then, at rotation angle θ3, magnetoelectric conversion elements 1B is changed from the state of facing protrusion 21 of magnetic moving body 20 to the state of facing recess 22 of magnetic moving body 20. This causes an abrupt increase in the resistance value of magnetoelectric conversion element 1B.

Then, at rotation angle θ4, magnetoelectric conversion elements 1A is changed from the state of facing protrusion 21 of magnetic moving body 20 to the state of facing recess 22 of magnetic moving body 20. This causes an abrupt increase in the resistance value of magnetoelectric conversion element 1A.

When comparing the case (A) in the comparative example with the case (B) in the fifth embodiment, output voltage V1 of differential amplifier circuit 32 is almost the same between the cases where magnetoelectric conversion elements 1A and 1B face recess 22 of magnetic moving body 20. In contrast, when magnetoelectric conversion elements 1A and 1B face protrusion 21 of magnetic moving body 20, the resistance value of magnetoelectric conversion element 1A in the case (B) in the fifth embodiment is smaller than the resistance value of magnetoelectric conversion element 1A in the case (A) in the comparative example. Consequently, output voltage V3 of differential amplifier circuit 32 in the case (B) in the fifth embodiment is also smaller than output voltage V2 of differential amplifier circuit 32 in the case (A) in the comparative example. In other words, it is found out that the change in the output of bridge circuit 2 caused by movement of magnetic moving body 20 is relatively great in the case (B) in the fifth embodiment.

Figure 30:
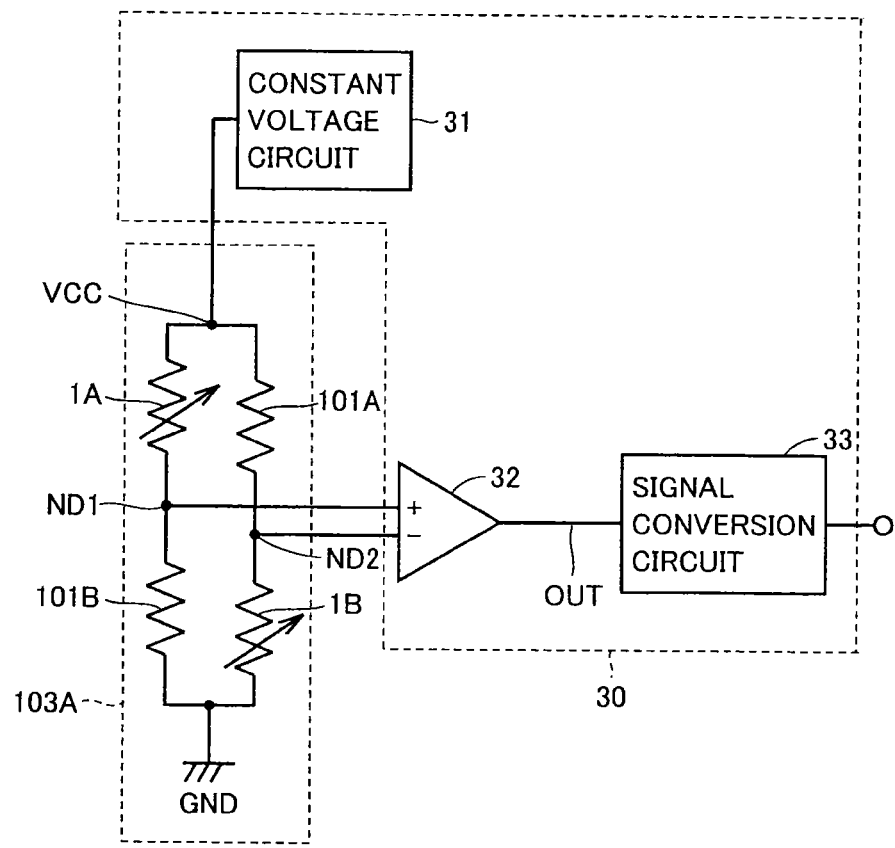
FIG. 30 is a circuit diagram showing a modification of bridge circuit 103 in FIG. 25.

FIG. 30 is a circuit diagram showing a modification of bridge circuit 103 in FIG. 25. Referring to FIG. 28, a bridge circuit 103A includes magnetoelectric conversion elements 1A, 1B and resistance elements 101A, 101B. Magnetoelectric conversion element 1A and resistance element 101B are connected in this order in series to each other between power supply node VCC (the first power supply node) and ground node GND (the second power supply node). Resistance element 101A and magnetoelectric conversion element 1B are connected in this order in series to each other between power supply node VCC and ground node GND and also connected in parallel to the series-connected body of magnetoelectric conversion element 1A and resistance element 101B. Differential amplifier circuit 32 amplifies the difference voltage between the voltage on connection node ND1 of magnetoelectric conversion element 1A and resistance element 101B, and the voltage on connection node ND2 of resistance element 101A and magnetoelectric conversion element 1B. Since other features are the same as those in the case in FIG. 28, the same or corresponding components are designated by the same reference characters, and description thereof will not be repeated.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1A to 1D magnetoelectric conversion element, 2 bridge circuit, 3 substrate, 4 magnet, 5 flux guide, 6, 7A, 7B, 8A, 8B plate-shaped portion, 9A, 9B protrusion (plate-shaped portion), 10 magnetic position detecting device, 18 notch portion, 19 opening portion, 20 magnetic moving body, 21 protrusion, 22 recess, 23 central axis (rotation axis), 25, 26B center portion, 29 magnetic lines of force, 30 detection circuit, 32 differential amplifier circuit, 71, 72 virtual plane, 101A, 101B resistance element, 103, 103A bridge circuit, 105, 107, 108 flux guide, 110 to 115 magnetic position detecting device, ND1, ND2 connection node, VCC power supply node, GND ground node.

The invention claimed is:
1. A magnetic position detecting device comprising:
a magnet generating a magnetic field;
first and second magnetoelectric conversion elements each provided on a first virtual plane and having a resistance value that changes in accordance with a change in said magnetic field caused by movement of a magnetic moving body;
a detection circuit detecting movement of said magnetic moving body based on the change in the resistance value of each of said first and second magnetoelectric conversion elements; and
a flux guide made of a magnetic material and disposed between said magnet and said first and second magnetoelectric conversion elements, said flux guide including
first and second protrusions arranged spaced apart from each other in a first direction parallel to said first virtual plane, said first and second protrusions each protruding in a direction toward said first virtual plane, and
a specific portion provided between and apart from said first protrusion and said second protrusion;
said first magnetoelectric conversion element being provided closer to said specific portion as compared with said second magnetoelectric conversion element,
said second magnetoelectric conversion element being provided between said first magnetoelectric conversion element and said first protrusion, as seen in a second direction perpendicular to said first virtual plane, and
said specific portion being different in shape or material from the other portion of said flux guide except said specific portion between said first protrusion and said second protrusion such that, as compared to a case where said specific portion is not provided, there is a relatively great difference between a change in a component of a magnetic field parallel to said first virtual plane in a position of said first magnetoelectric conversion element and a change in the component of the magnetic field parallel to said first virtual plane in a position of said second magnetoelectric conversion element when said magnetic moving body moves.

2. The magnetic position detecting device according to claim 1, further comprising third and fourth magnetoelectric conversion elements each provided on said first virtual plane and having a resistance value that changes in accordance with a change in said magnetic field caused by movement of said magnetic moving body, wherein
said detection circuit detects movement of said magnetic moving body based on the change in the resistance value of each of said first to fourth magnetoelectric conversion elements,
said fourth magnetoelectric conversion element is provided closer to said specific portion as compared with said third magnetoelectric conversion element, and
said third magnetoelectric conversion element is provided between said fourth magnetoelectric conversion element and said second protrusion, as seen in said second direction.

3. The magnetic position detecting device according to claim 1, wherein said specific portion is a concave portion recessed in a direction opposite to said first virtual plane.

4. The magnetic position detecting device according to claim 1, wherein
said flux guide further includes
a first plate-shaped portion extending along said first virtual plane,
second and third plate-shaped portions connected to both ends, respectively, in said first direction of said first plate-shaped portion, said second and third plate-shaped portions each extending toward said first virtual plane,
a fourth plate-shaped portion connected to an end of said second plate-shaped portion on a side closer to said first virtual plane, and extending along said first virtual plane in a direction opposite to said first plate-shaped portion,
a fifth plate-shaped portion connected to an end of said third plate-shaped portion on a side closer to said first virtual plane, and extending along said first virtual plane in the direction opposite to said first plate-shaped portion,
a sixth plate-shaped portion connected to an end of said fourth plate-shaped portion on a side opposite to said first plate-shaped portion, extending toward said first virtual plane, and corresponding to said first protrusion, and
a seventh plate-shaped portion connected to an end of said fifth plate-shaped portion on a side opposite to said first plate-shaped portion, extending toward said first virtual plane, and corresponding to said second protrusion, and
said first to third plate-shaped portions correspond to said specific portion.

5. The magnetic position detecting device according to claim 1, wherein
said specific portion is a notch portion formed so as to open at one end face of said flux guide in a third direction perpendicular to said first and second directions, and
said magnetic moving body moves in a region at a prescribed distance from said one end face as seen in said second direction.

6. The magnetic position detecting device according to claim 1, wherein said specific portion is an opening portion provided so as to divide said flux guide into a section on a side of said first protrusion and a section on a side of said second protrusion.

7. The magnetic position detecting device according to claim 1, wherein
said specific portion is a portion of said flux guide between said first and second protrusions that has a length greater in a third direction perpendicular to said first and second directions than in other portions between said first and second protrusions due to a configuration in which a portion at one end face in said third direction protrudes in said third direction, and
said magnetic moving body moves in a region at a prescribed distance from said one end face as seen in said second direction.

8. The magnetic position detecting device according to claim 2, wherein
said specific portion is a portion of said flux guide between said first and second protrusions that has a length greater in a third direction perpendicular to said first and second directions than in other portions between said first and second protrusions due to a configuration in which a portion at one end face in said third direction protrudes in said third direction, and
said magnetic moving body moves in a region at a prescribed distance from said one end face as seen in said second direction.

9. The magnetic position detecting device according to claim 1, wherein said specific portion is lower in magnetic permeability than said other portion.

10. The magnetic position detecting device according to claim 1, wherein
said magnetic moving body is formed in a shape of a disc rotating around a central axis parallel to said second direction,
said magnetic moving body has a peripheral edge portion provided with one or more protrusions protruding in a radial direction of said disc,
said magnetic position detecting device is provided at a prescribed distance from said magnetic moving body as seen in a direction of said central axis,
a magnetization direction of said magnet is parallel to said central axis, and
said first direction extends in a circumferential direction of said disc of said magnetic moving body.

* * * * *